(12) United States Patent
Fareed et al.

(10) Patent No.: US 11,742,390 B2
(45) Date of Patent: Aug. 29, 2023

(54) ELECTRONIC DEVICE WITH GALLIUM NITRIDE TRANSISTORS AND METHOD OF MAKING SAME

(71) Applicant: Texas Instruments Incorporated, Dallas, TX (US)

(72) Inventors: Qhalid R S Fareed, Plano, TX (US); Dong Seup Lee, Mckinney, TX (US); Nicholas S. Dellas, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/085,558

(22) Filed: Oct. 30, 2020

(65) Prior Publication Data
US 2022/0140087 A1    May 5, 2022

(51) Int. Cl.
*H01L 29/15*    (2006.01)
*H01L 21/02*    (2006.01)

(52) U.S. Cl.
CPC ...... *H01L 29/151* (2013.01); *H01L 21/02458* (2013.01); *H01L 21/02507* (2013.01); *H01L 21/02532* (2013.01)

(58) Field of Classification Search
None
See application file for complete search history.

(56) References Cited

U.S. PATENT DOCUMENTS

| | | | |
|---|---|---|---|
| 2010/0244101 A1* | 9/2010 | Kokawa | H01L 21/02502 257/E29.081 |
| 2014/0091314 A1* | 4/2014 | Ishiguro | H01L 29/7787 257/76 |
| 2014/0327011 A1 | 11/2014 | Pendharkar et al. | |
| 2016/0218202 A1 | 7/2016 | Fareed et al. | |
| 2016/0293596 A1 | 10/2016 | Fareed et al. | |
| 2017/0170283 A1* | 6/2017 | Laboutin | H01L 21/02381 |
| 2017/0186859 A1 | 6/2017 | Haider et al. | |
| 2018/0284599 A1* | 10/2018 | Jeon | G03F 1/22 |
| 2018/0323297 A1 | 11/2018 | Suh et al. | |
| 2019/0181240 A1 | 6/2019 | Fareed et al. | |
| 2020/0185499 A1 | 6/2020 | Lee et al. | |
| 2020/0203520 A1 | 6/2020 | Dellas et al. | |
| 2020/0303535 A1 | 9/2020 | Joh et al. | |
| 2021/0057561 A1* | 2/2021 | Hsieh | H01L 21/0251 |

* cited by examiner

*Primary Examiner* — Hsien Ming Lee
(74) *Attorney, Agent, or Firm* — Yudong Kim; Frank D. Cimino

(57) ABSTRACT

Fabrication methods and gallium nitride transistors, in which an electronic device includes a substrate, a buffer structure, a hetero-epitaxy structure over the buffer structure, and a transistor over or in the hetero-epitaxy structure. In one example, the buffer structure has an extrinsically carbon doped gallium nitride layer over a dual superlattice stack or over a multilayer composition graded aluminum gallium nitride stack, and a silicon nitride cap layer over the hetero-epitaxy structure.

20 Claims, 27 Drawing Sheets

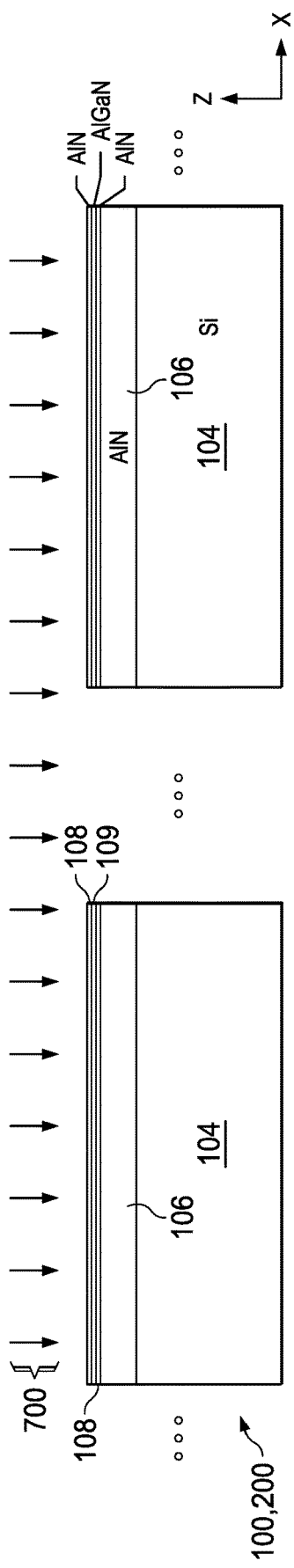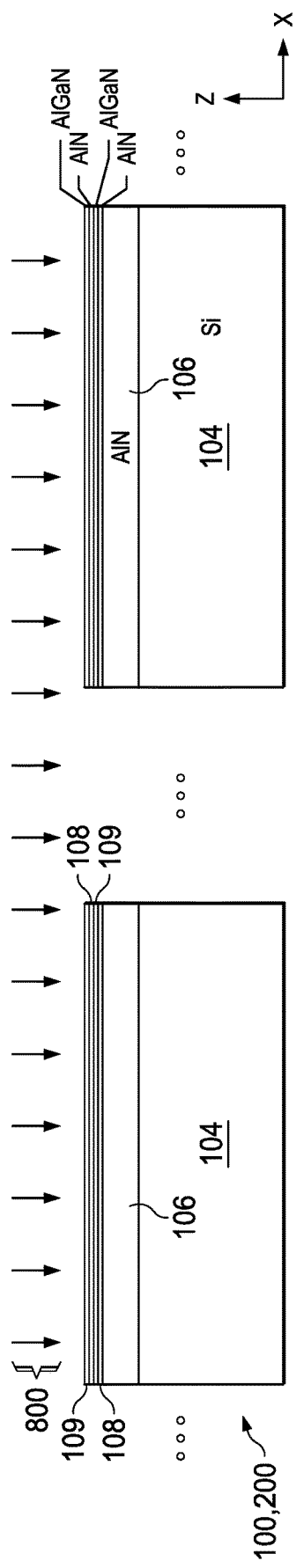

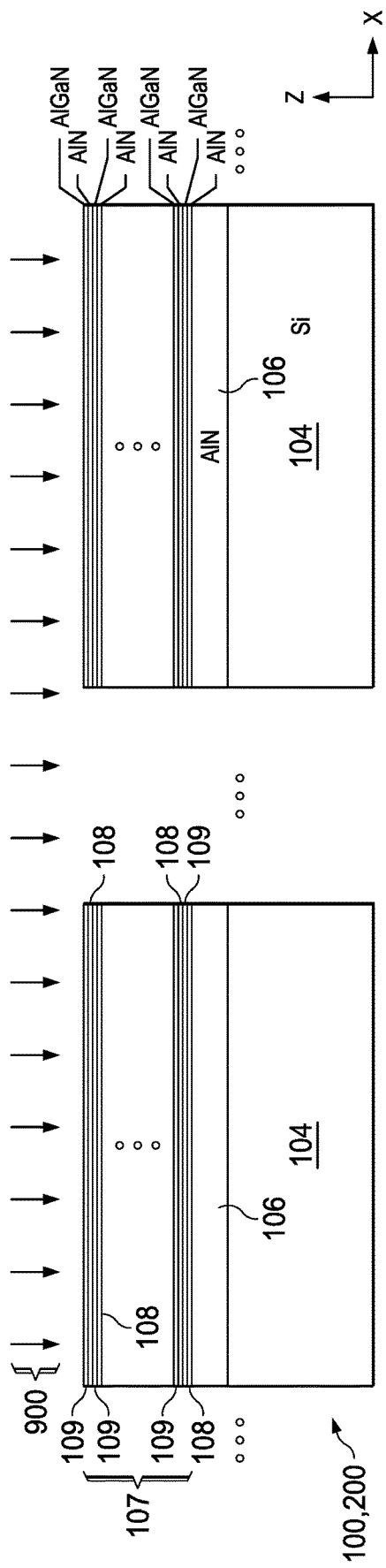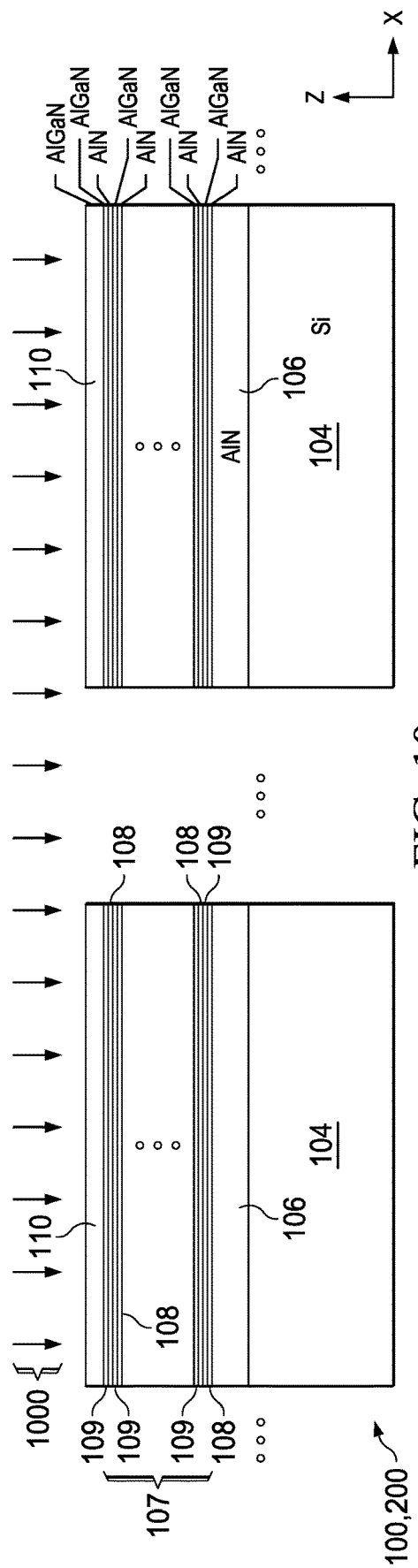

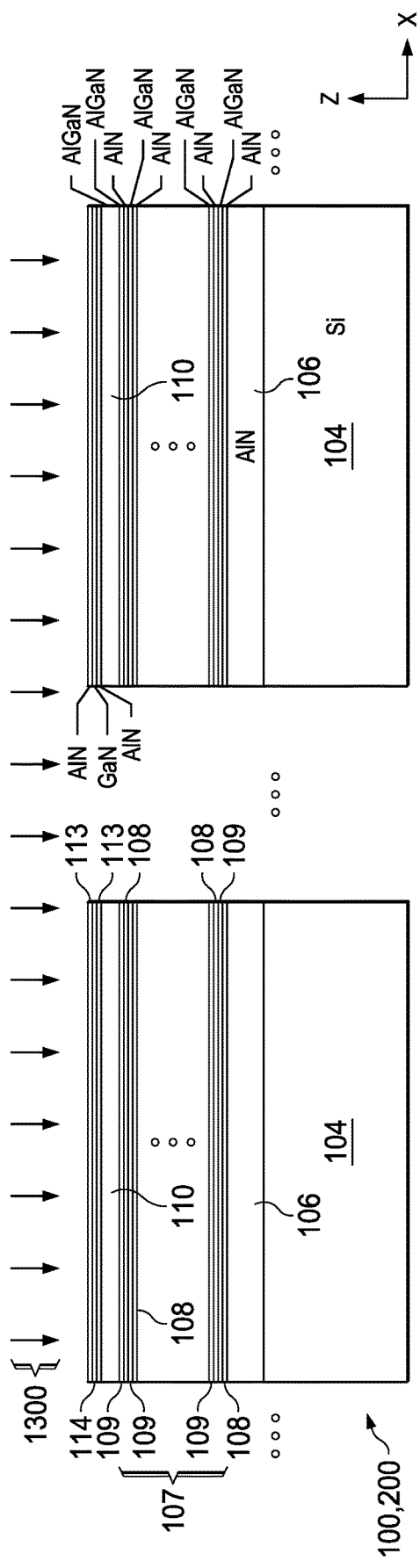
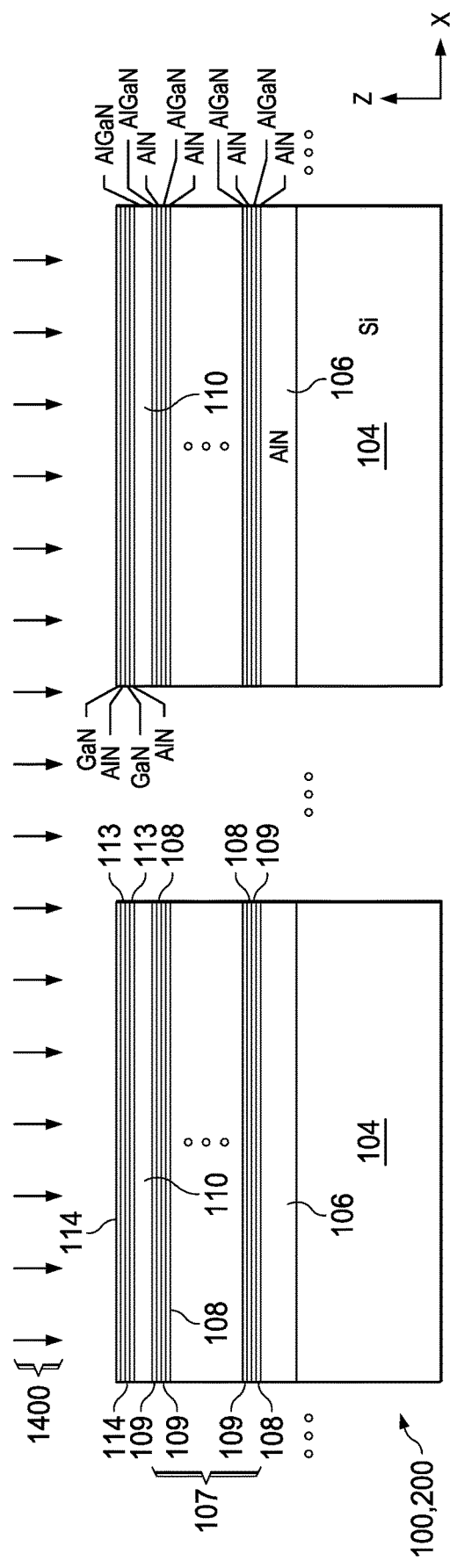
FIG. 13
FIG. 14

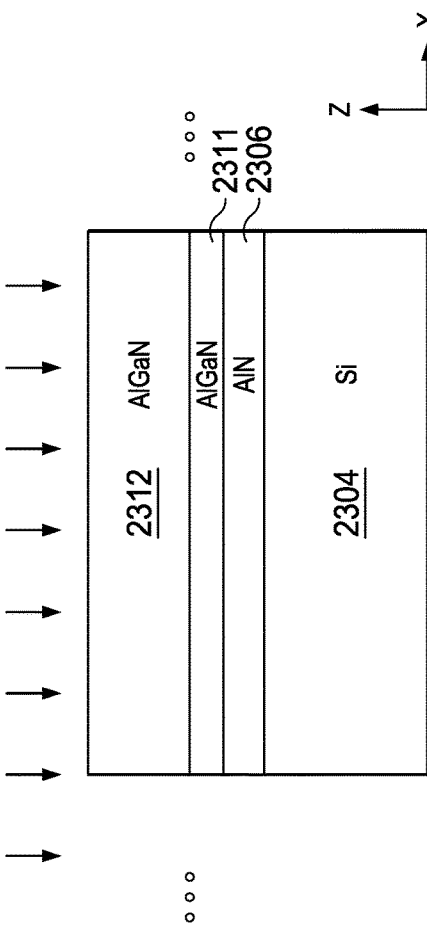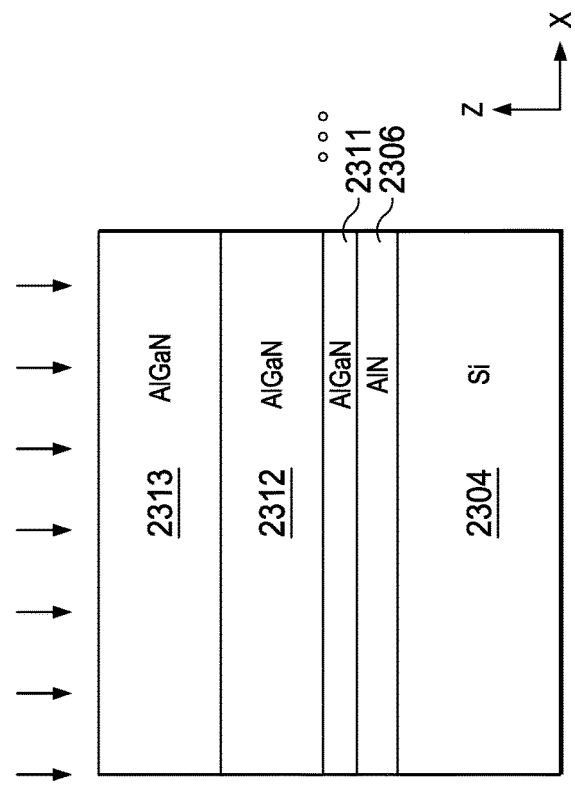
FIG. 28
FIG. 29

ELECTRONIC DEVICE WITH GALLIUM NITRIDE TRANSISTORS AND METHOD OF MAKING SAME

BACKGROUND

Gallium nitride (GaN) transistors provide certain performance advantages over silicon, including lower on-state resistance (e.g., drain-source resistance or RDSON), lower switching losses, and improved breakdown voltage. In high-power switching applications, high breakdown voltage and low current collapse ratings are important. Epitaxial deposition of buffer layers and some GaN transistors involves intrinsic carbon doping due to use of a metal organic source, and the intrinsic carbon doping helps current collapse performance. Improved current collapse performance can be aided by increased carbon doping but increasing the intrinsic carbon doping requires decreasing the epitaxial deposition process temperature, which in turn adversely affects the quality of the deposited GaN material. In addition, intrinsic carbon doping is not uniform across a processed wafer, where die areas at or near the center of the wafer typically have less carbon doping than the edge regions of the wafer. Accordingly, current collapse performance varies as a function of location in the processed wafer, which reduces production yield and increases product cost. In addition, some GaN transistor designs include an epitaxially deposited top aluminum gallium nitride (AlGaN) layer that is exposed during subsequent processing, leading to oxidation and surface micro-pitting that can cause leakage performance issues and early product failures.

SUMMARY

In accordance with one aspect, an electronic device, such as an integrated circuit or packaged transistor product, includes a substrate, a buffer structure, a hetero-epitaxy structure over the buffer, and a transistor over or in the hetero-epitaxy structure. The buffer structure has a dual superlattice stack that includes a first superlattice over an aluminum nitride layer of the buffer structure, an aluminum gallium nitride interlayer over the first superlattice, and a second superlattice over the aluminum gallium nitride interlayer. The first superlattice includes alternating pairs of respective aluminum nitride and aluminum gallium nitride sublayers, and the second superlattice includes alternating pairs of respective aluminum nitride and gallium nitride sublayers. In certain examples, the electronic device also has a silicon nitride cap layer over the hetero-epitaxy structure.

In accordance with another aspect, an electronic device includes a substrate, a buffer structure, a hetero-epitaxy structure over the buffer, a transistor over or in the hetero-epitaxy structure, and a silicon nitride cap layer over the hetero-epitaxy structure. In certain examples, the buffer structure has a multilayer composition graded aluminum gallium nitride stack that includes a first aluminum gallium nitride sublayer over an aluminum nitride layer of the buffer structure, a second aluminum gallium nitride sublayer over the first aluminum gallium nitride sublayer, and a third aluminum gallium nitride sublayer over the second aluminum gallium nitride sublayer. In one example, the first aluminum gallium nitride sublayer has a first aluminum concentration, the second aluminum gallium nitride sublayer has a lower second aluminum concentration, and the third aluminum gallium nitride sublayer has a still lower third aluminum concentration.

In accordance with yet another aspect, a method comprises forming a buffer structure over a substrate, including performing an epitaxial deposition process that deposits at least one layer of the buffer structure using an extrinsic carbon source gas, as well as forming a hetero-epitaxy structure over the buffer structure, and forming a transistor having a gate over the hetero-epitaxy structure, a drain partially in the hetero-epitaxy structure and spaced apart from the gate, and a source partially in the hetero-epitaxy structure and spaced apart from the gate and from the drain.

In one example, the extrinsic carbon source gas is or includes ethene. In certain examples, forming the buffer structure comprises: performing a first epitaxial deposition process that forms a first superlattice over the aluminum nitride layer having alternating pairs of aluminum nitride sublayers and aluminum gallium nitride sublayers; as well as performing a second epitaxial deposition process that forms an aluminum gallium nitride interlayer over the first superlattice; and performing a third epitaxial deposition process that forms a second superlattice over the aluminum gallium nitride interlayer having alternating pairs of aluminum nitride sublayers and gallium nitride sublayers.

In another example, forming the buffer structure comprises: performing a first epitaxial deposition process that forms a first aluminum gallium nitride sublayer over an aluminum nitride layer; performing a second epitaxial deposition process that forms a second aluminum gallium nitride sublayer over the first aluminum gallium nitride sublayer using the extrinsic carbon source gas; and performing a third epitaxial deposition process that forms a third aluminum gallium nitride sublayer over the second aluminum gallium nitride sublayer using the extrinsic carbon source gas.

In these or other examples, the method further includes performing a metal organic chemical vapor deposition process that forms a silicon nitride cap layer over the hetero-epitaxy structure.

BRIEF DESCRIPTION OF THE DRAWINGS

FIGS. 4-21 are partial sectional side elevation views of the electronic device of FIG. 2 undergoing fabrication processing according to the method of FIG. 3.

FIGS. 26-35 are partial sectional side elevation views of the electronic device of FIG. 24 undergoing fabrication processing according to the method of FIG. 25.

DETAILED DESCRIPTION

Figure 1:
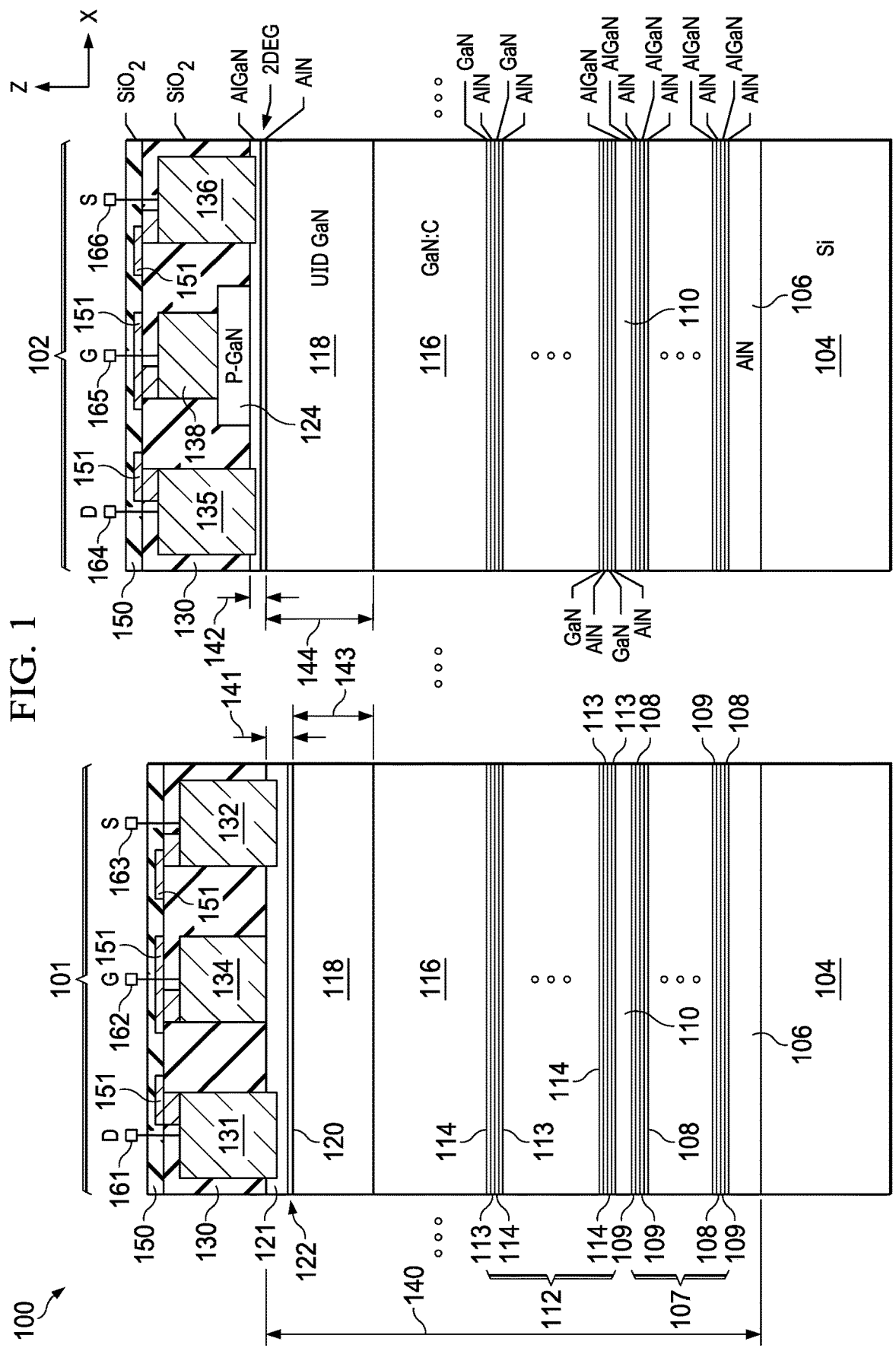
FIG. 1 is a partial sectional side elevation view of an electronic device with a depletion mode GaN transistor and an enhancement mode GaN transistor having extrinsically carbon doped buffer layers and a dual superlattice buffer according to one aspect.

In the drawings, like reference numerals refer to like elements throughout, and the various features are not necessarily drawn to scale. One or more operational characteristics of various circuits, systems and/or components are hereinafter described in the context of functions which in some cases result from configuration and/or interconnection of various structures when circuitry is powered and operating.

FIG. 1 shows a partial side view of an electronic device 100 with a depletion mode GaN transistor 101 and an enhancement mode GaN transistor 102 having extrinsically carbon doped buffer layers and a dual superlattice buffer according to one aspect. Whereas intrinsic carbon doping occurs through use of a metal organic source for depositing the primary material of a layer, extrinsic carbon doping results from deposition processes that uses an additional carbon source gas during deposition processing. In one example, intrinsic carbon doping includes deposition using trimethyl gallium/trimethyl aluminum precursor sources, and the doping is controlled by adjusting temperature and/or pressure of the deposition process. In contrast, extrinsic carbon doping is performed with an external precursor source such as ethene $C_2H_4$, which can be largely independent of pressure and/or temperature, for example, to provide a larger process margins for a GaN or AlGaN epitaxial deposition process. The electronic device 100 includes a substrate 104, such as silicon (Si) or a silicon-on-insulator (SOI) structure of any suitable thickness along the illustrated vertical (Z) direction. The illustrated portion of the electronic device 100 extends in a first lateral direction (X) as well as an orthogonal second lateral direction (a Y direction extending into and out of the page in FIG. 1).

The electronic device 100 further includes a buffer structure having an aluminum nitride (AlN) layer 106 and a dual superlattice stack over the aluminum nitride layer 106. In one example, the aluminum nitride layer 106 has a thickness of 300-600 nm. The dual superlattice stack includes a first superlattice 107 having alternating pairs of respective aluminum nitride and aluminum gallium nitride (AlGaN) sublayers 108 and 109 over the aluminum nitride layer 106, an aluminum gallium nitride interlayer 110 over the first superlattice 107, and a second superlattice 112 having alternating pairs of respective aluminum nitride and gallium nitride sublayers 113 and 114 over the aluminum gallium nitride interlayer 110. In one example, the aluminum nitride sublayers 108 of the first superlattice 107 have respective thicknesses of 10-20 nm. In this example, moreover, the aluminum gallium nitride sublayers 109 of the first superlattice 107 have respective thicknesses of 15-35 nm, and an aluminum concentration of 60-80%. In this or another example, an average aluminum concentration of the first super lattice 107 is 60-80%, such as about 70%. In one implementation, the first superlattice includes 20 to 50 pairs, such as 33 pairs of the respective aluminum nitride and aluminum gallium nitride sublayers 108 and 109.

In one example, the aluminum gallium nitride interlayer 110 has a thickness of 10-100 nm, and an aluminum concentration that is less than the average aluminum concentration of the first superlattice 107. In one implementation, the aluminum gallium nitride interlayer 110 has a thickness that is greater than the thicknesses of the individual aluminum gallium nitride sublayers 109 of the first superlattice 107. In this or another example, the aluminum concentration of the aluminum gallium nitride interlayer 110 is around 40-60%, such as about 50%. The aluminum gallium nitride interlayer 110 provides a composition transition layer between the first superlattice 107 and the second superlattice 112. In addition, the aluminum gallium nitride interlayer 110 acts as strain relieving layer between two different composition super lattices 107 and 112.

In one example, the aluminum nitride sublayers 113 of the second superlattice 112 have respective thicknesses of 10-25 nm. In this example, the gallium nitride sublayers 114 of the second superlattice 112 have respective thicknesses of 15-35 nm. In one implementation, the second superlattice 112 has 30-70 pairs, such as 47 alternating pairs of the respective aluminum nitride and gallium nitride sublayers 113 and 114. In one example, the second superlattice 112 has more sublayers than does the first superlattice. In this or another example, an average aluminum concentration of the second superlattice 112 is less than the aluminum concentration of the aluminum gallium nitride interlayer 110, for example, 20-40%, such as about 30%. The gallium nitride sublayers 114 and other gallium nitride layers of the described examples can include small amounts of aluminum, which is less than the aluminum concentrations of the aluminum nitride and aluminum gallium nitride layers. In certain examples, the gallium nitride layers of the described examples are formed with no aluminum source during deposition, and any aluminum present in the final layer may be the result of diffusion or other migration mechanisms during fabrication processing.

The electronic device 100 further includes a carbon doped gallium nitride layer 116 (e.g., labeled "GaN:C" in the figures) over the second superlattice 112, and a gallium nitride layer 118 (e.g., labeled "UID GaN") over the carbon doped gallium nitride layer 116. In one example, the carbon doped gallium nitride layer 116 has a thickness of 0.5-2.0 μm. In this or another example, the gallium nitride layer 118 has a thickness of 0.1-0.5 μm. In one implementation, the gallium nitride layer 118 includes carbon. In one example, the gallium nitride layer 118 has a carbon doping concentration of less than 2E16 atoms/cm$^3$ (e.g., $<2\times10^{16}$ atoms*cm$^{-3}$) that is nearly three orders of magnitude lower than that of the underlying carbon doped gallium nitride layer 116 (e.g., about 1E19 atoms/cm$^3$ or $1\times10^{19}$ atoms* cm$^{-3}$).

The electronic device 100 also includes a hetero-epitaxy structure having an aluminum nitride layer 120 over the gallium nitride layer 118, and an aluminum gallium nitride layer 121 over the aluminum nitride layer 120. The hetero junction at the interface between the aluminum gallium nitride layer 121 and the gallium nitride layer 118 forms a two-dimensional electron gas region 122 (e.g., labeled "2DEG" in the figures). In one example, the hetero-epitaxy structure, including the layers 120 and 121 has a total thickness of 10-30 nm. The electronic device 100 also includes one or more transistors, including the depletion mode transistor 101, and the enhancement mode transistor 102 in the illustrated implementation. In another example, the electronic device 100 includes one or more depletion mode transistors 101 and no enhancement mode transistors 102. In another example, the electronic device 100 includes one or more enhancement mode transistors 102 and no depletion mode transistors 101. The electronic device 100 includes a p-doped gallium nitride layer 124 over the aluminum gallium nitride layer 121 of the hetero-epitaxy structure 120, 121 for the gate of the enhancement mode transistor 102. In one example, the p-doped gallium nitride layer 124 includes magnesium (Mg) dopants and has a thickness of 50-200 nm, such as about 70 nm in one implementation.

The electronic device 100 further includes a metallization structure with a first pre-metal dielectric (e.g., PMD) layer 130, for example, including silicon nitride (SiN) or silicon dioxide ($SiO_2$), with various conductive metal structures formed therein, including a depletion mode transistor drain contact or electrode 131, a depletion mode transistor source contact or electrode 132, a depletion mode transistor gate contact or electrode 134, an enhancement mode transistor drain contact or electrode 135, an enhancement mode transistor source contact or electrode 136, an enhancement mode transistor gate contact or electrode 138, and one or more conductive vias provide an electrical interconnection of various transistor terminals for routing in a second metallization structure level.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness 140 of approximately 4-6 μm, such as 5.1 μm in one example. In the depletion mode transistor 101, the hetero-epitaxy structure including the layers 120 and 121 has a total thickness 141 of approximately 10-30 nm, and the hetero-epitaxy structure in the enhancement mode transistor 102 has a total thickness 142 of 10-20 nm, where the aluminum nitride layer 120 in one example has a thickness of 5-15 Å, and the aluminum gallium nitride layer 121 has a thickness of 20-25 nm in the depletion mode transistor 101, and the gallium nitride layer 121 in the enhancement mode transistor 102 has a smaller thickness. In the illustrated example, the gallium nitride layer 118 has a thickness 143 in the depletion mode transistor 101 of approximately 0.1-0.5 μm, and the gallium nitride layer 118 in the enhancement mode transistor 102 has a thickness 144 of approximately 0.45 μm. In the illustrated example, the aluminum gallium nitride layer 121 in the depletion mode transistor 101 has a thickness of about 20 nm and an aluminum concentration of about 26%, and the aluminum gallium nitride layer 121 in the enhancement mode transistor 102 has a thickness of about 10-20 nm and an aluminum concentration of about 20-25%. In another example, the aluminum gallium nitride layer 121 in the enhancement mode transistor 102 has a thickness of about 17 nm and an aluminum concentration of about 20%.

Figure 22:
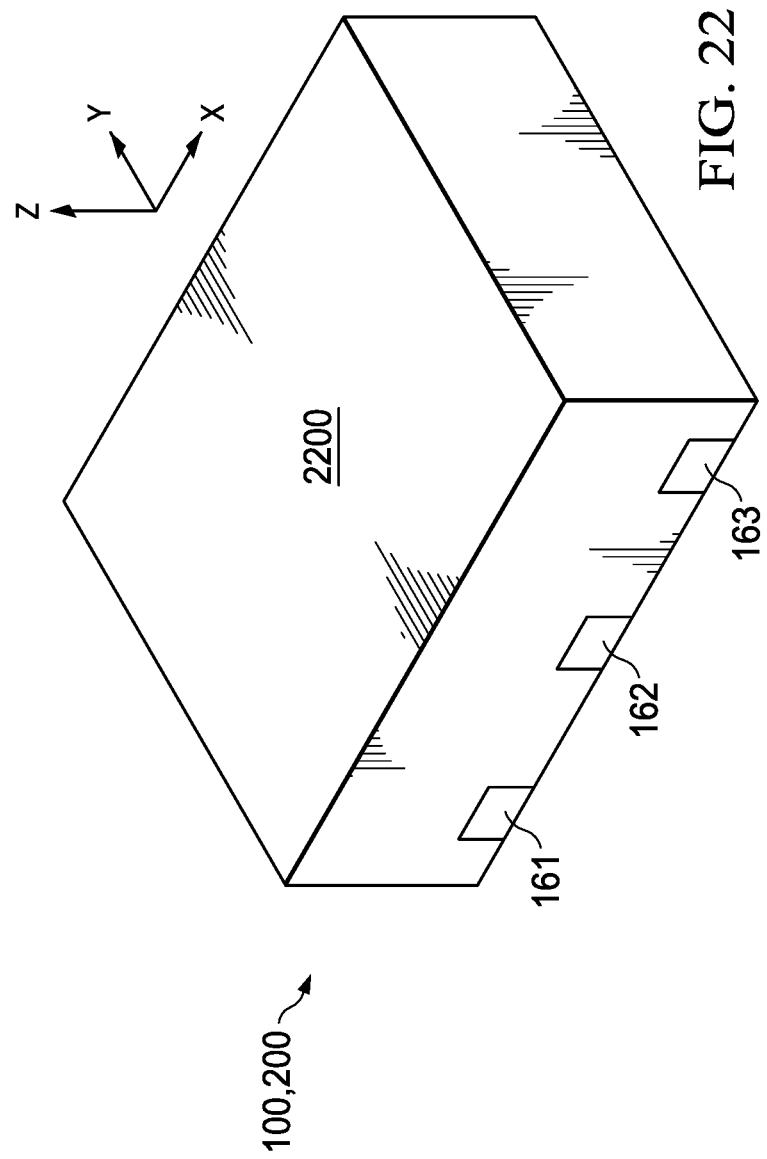
FIG. 22 is a perspective view of a packaged electronic device fabricated according to the method of FIG. 3.

The electronic device 100 in FIG. 1 further includes a second metallization structure level with a dielectric layer 150 (e.g., silicon nitride or silicon dioxide) having one or more conductive routing features 151 (e.g., aluminum, copper, etc.), for example, to provide routing of drain, source and gate connections and associated signals to one another and/or to conductive bond pads, or other externally exposed conductive features by which the transistors 101 and 102 can be electrically interconnected with other circuitry, for example, using bond wires or lead frame electrical connections to integrated circuit leads, such as pins or pads in a packaged electronic device, as illustrated below in the example packaged electronic device of FIG. 22.

The depletion mode transistor 101 includes a gate 162 (e.g., labeled "G") over the aluminum gallium nitride layer 121 of the hetero-epitaxy structure 120, 121, a drain 161 (e.g., labeled "D") partially in the aluminum gallium nitride layer 121 of the hetero-epitaxy structure 120, 121 and spaced apart from the gate 162 along the lateral X direction. The depletion mode transistor 101 also includes a source 163 (e.g., labeled "S") partially in the aluminum gallium nitride layer 121 of the hetero-epitaxy structure 120, 121, where the source 163 is spaced apart from the gate 162 and from the drain 161 in the lateral X direction. The enhancement mode transistor 102 includes a gate 165 (e.g., labeled "G") over the p-doped gallium nitride layer 124, a drain 164 (e.g., labeled "D") partially in the aluminum gallium nitride layer 121 of the hetero-epitaxy structure 120, 121, where the drain 164 is spaced apart from the gate 165 along the lateral X direction. The enhancement mode transistor 102 also includes a source 166 (e.g., labeled "S") partially in the aluminum gallium nitride layer 121 of the hetero-epitaxy structure 120, 121, where the source 166 is spaced apart from the gate 165 and from the drain 164 along the lateral X direction.

Figure 2:
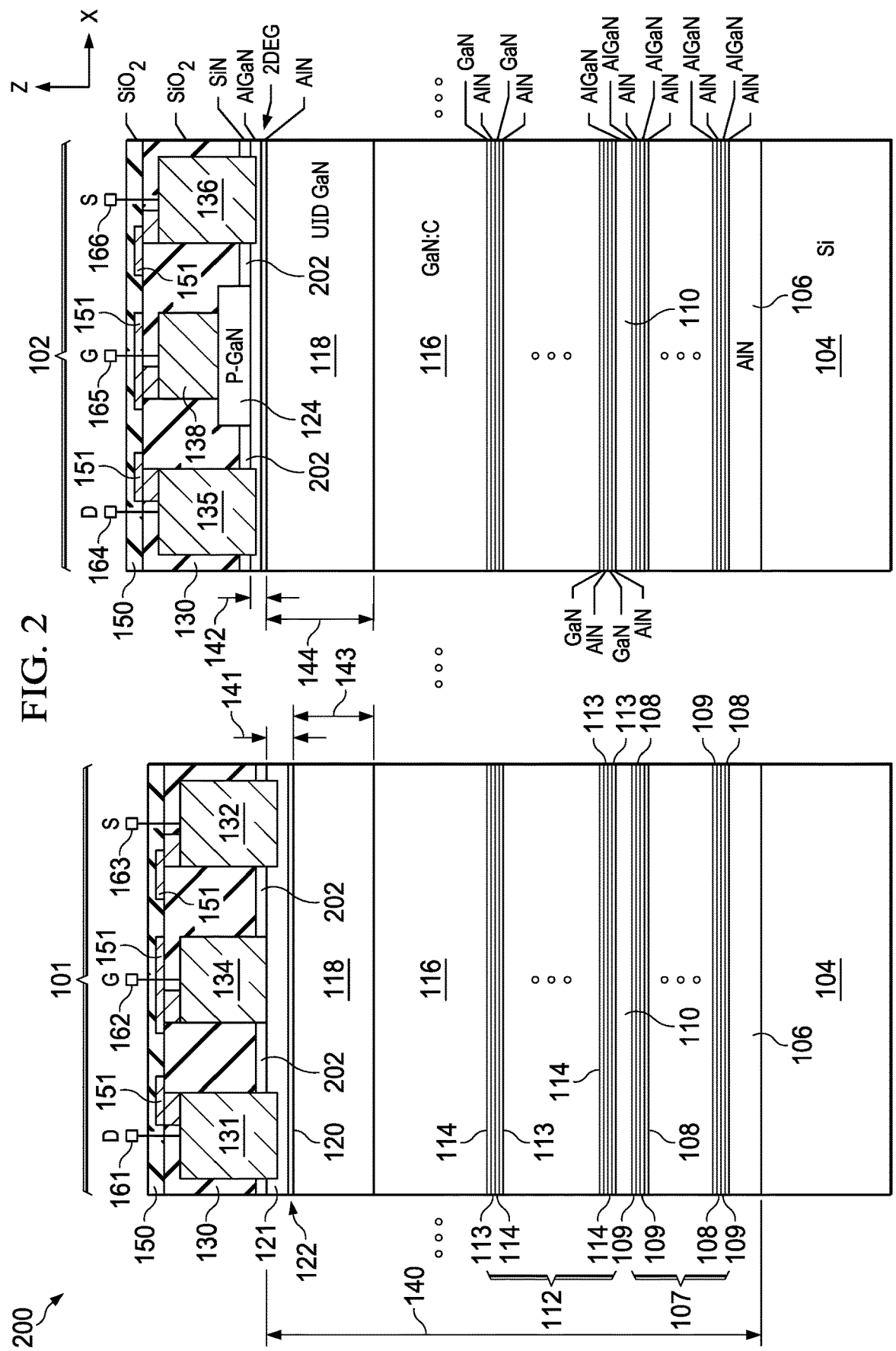
FIG. 2 is a partial sectional side elevation view of another electronic device with GaN transistors having extrinsically carbon doped buffer layers, a dual superlattice buffer and a SiN cap layer according to another aspect.

FIG. 2 shows another electronic device 200 with GaN transistors 101 and 102 having extrinsically carbon doped buffer layers, a dual superlattice buffer and a SiN cap layer 202 according to another aspect. The electronic device 200 in this example includes similarly numbered structures and features as described above in connection with FIG. 1. In addition, the electronic device 200 further includes a silicon nitride cap layer 202 over the aluminum gallium nitride layer 121 of the hetero-epitaxy structure 120, 121. In one example, the silicon nitride cap layer 202 has a thickness of 2-10 nm. The silicon nitride cap layer 202 in the electronic device 200 of FIG. 2 acts as a surface passivation layer that protects the surface of the top aluminum gallium nitride layer 121 from the post-epitaxial processing, thereby mitigating or avoiding micro pitting and leakage problems.

In addition, the dual superlattice structures 107, 110 and 112 in the electronic devices 100 and 200 of FIGS. 1 and 2 advantageously allow the epitaxial stack thickness 140 to be reduced for a given breakdown voltage rating compared with composition graded or other buffer layer configurations. In addition, the AlGaN interlayer 110 in one example provides a transition between the higher average aluminum content of the first superlattice 107 and the lower average aluminum content of the second superlattice 112. In the dual superlattice structure 107, 110 and 112, the aluminum nitride provides a larger bandgap material (e.g., 6.2 V), and is insulating compared with other buffer layer configurations that do not include aluminum nitride. The dual superlattice structure in these examples provides lowered vertical leakage, and the overall stack thickness 140 can be reduced for a given desired breakdown voltage rating.

Further, the carbon content of the carbon doped gallium nitride layer 116 (GaN:C) helps mitigate current collapse in operation of the transistors 101 and 102 and provides carbon content uniformity across a wafer during fabrication, leading to improved production yield and reduced cost. As discussed further below in connection with FIG. 3, moreover, the carbon doped gallium nitride layer 116 in one example is fabricated using an extrinsic carbon source, such as controllable hydrocarbon gas (such as ethene, hexene) flow during epitaxial deposition, to allow the epitaxial gallium nitride growth at a higher temperature for better gallium nitride layer quality, while providing generally temperature independent control of the carbon doping for improved current collapse performance at the lateral center and edge regions of a processed wafer without tradeoff in layer quality.

Figure 3:
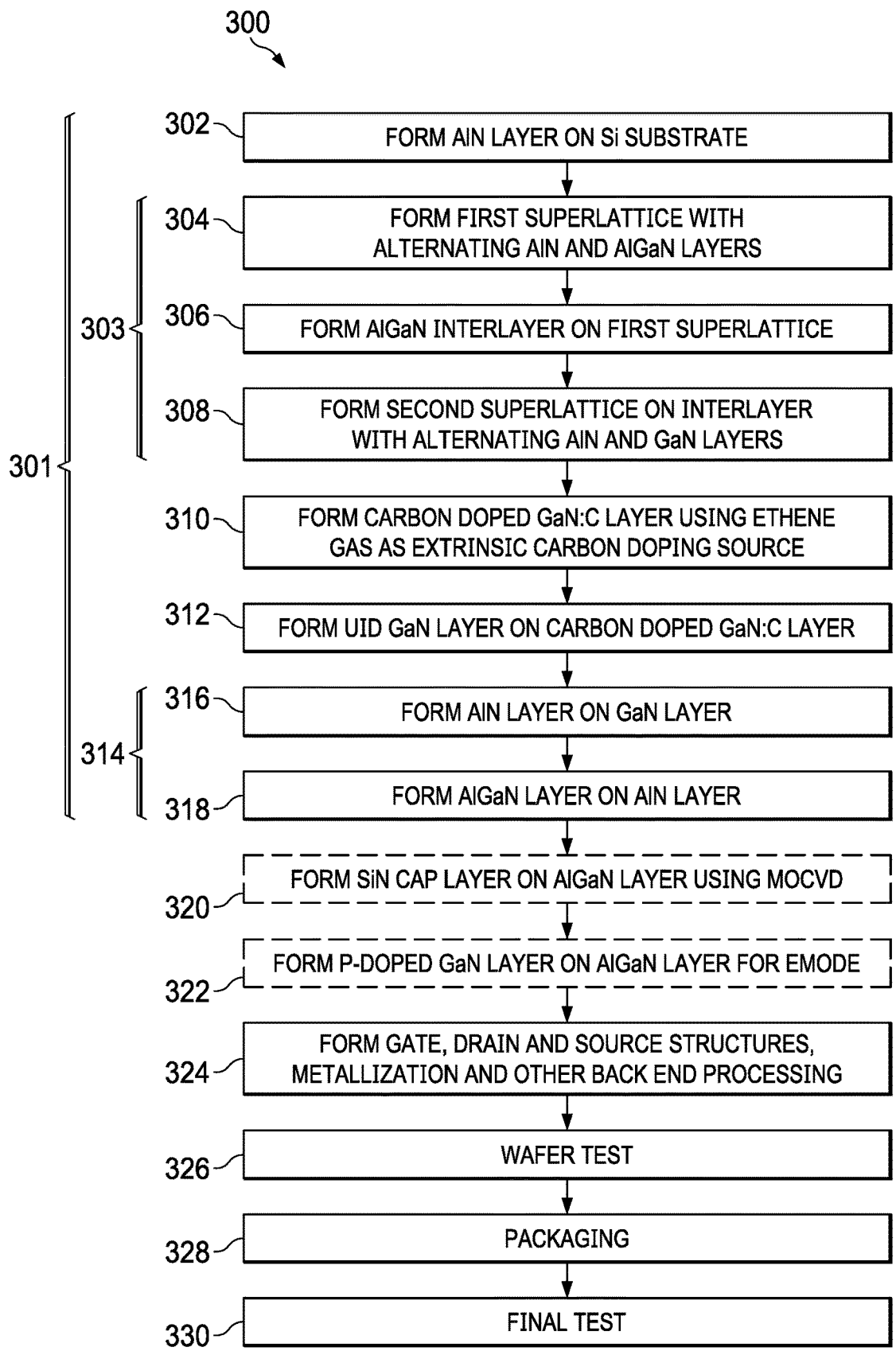
FIG. 3 is a flow diagram of a method for making an electronic device according to a further aspect.

Referring now to FIGS. 3-22, FIG. 3 shows an example method 300 of making an electronic device according to a further aspect, FIGS. 4-21 show partial side views of the electronic device 200 of FIG. 2 undergoing fabrication processing according to the method of FIG. 3, and FIG. 22 shows a packaged electronic device yielded by the method 300. The method 300 also includes example acts and events that can be used in fabricating the electronic device 100 of FIG. 1. The method 300 begins with a starting substrate, such as a silicon wafer, an SOI wafer, sapphire wafer, SiC wafer etc. An epitaxial deposition process or multiple epitaxial deposition processes are performed at 301, including forming the buffer structure 106, 107, 110, 112, 116 and 118 in FIGS. 1 and 2 over the substrate 104.

Figure 4:
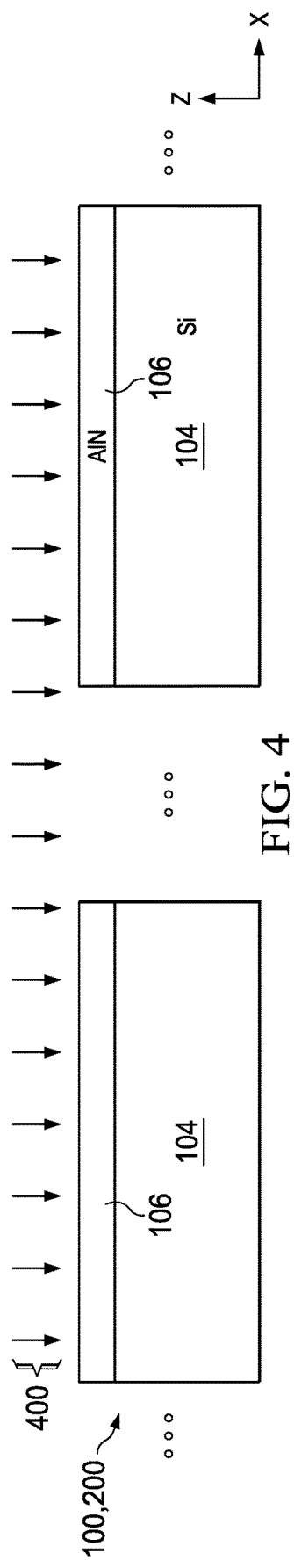

An aluminum nitride layer is formed over the substrate at 302. FIG. 4 shows one example, in which the aluminum nitride layer 106 in the above electronic devices 100 and 200 is deposited over an upper surface of the silicon substrate 104 using an epitaxial deposition process 400. In one example, the process 400 includes depositing aluminum nitride at a temperature of 1000-1150° C. to a thickness of 300-600 nm.

The buffer formation continues at 303 with forming the dual superlattice structure 107, 110, 112. This includes performing a first epitaxial deposition process at 304 that forms the first superlattice 107 over the aluminum nitride layer 106, where the first superlattice 107 as alternating pairs of aluminum nitride sublayers 108 and aluminum gallium nitride sublayers 109. The first epitaxial deposition process at 304 can be a continuous process with changes of process parameters and materials between sublayers, or a series of separate deposition processes.

Figure 5:
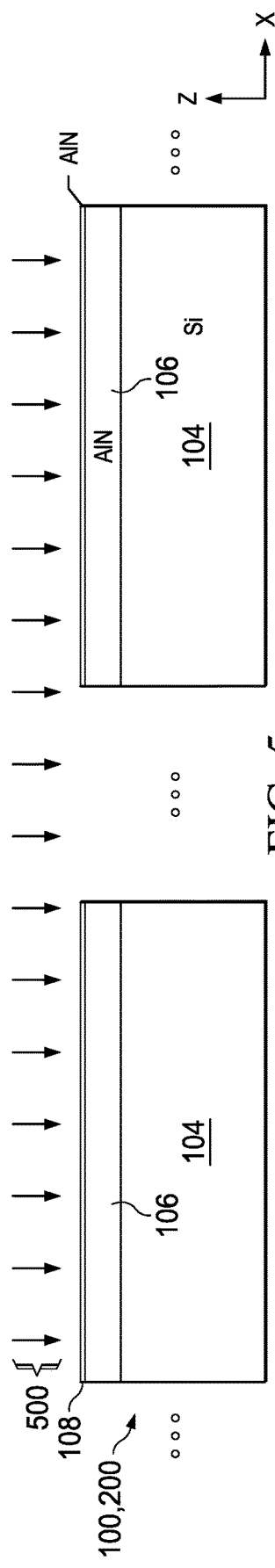
Figure 6:
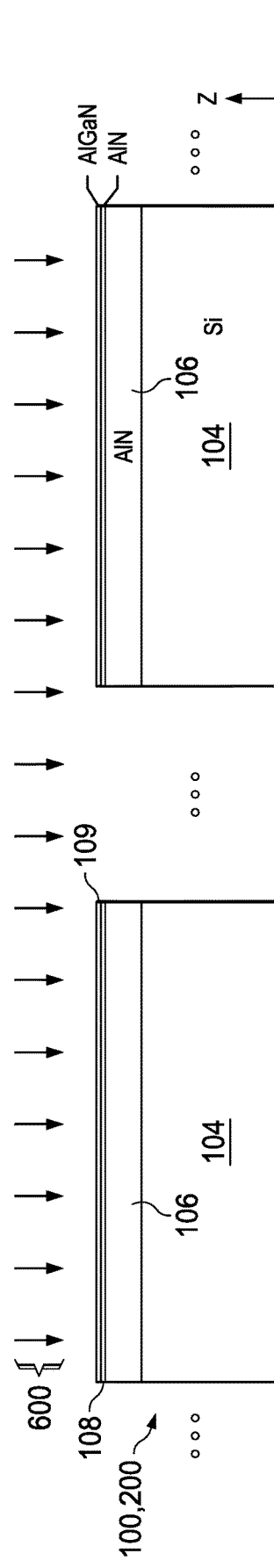

At 304 in this example, the first superlattice 107 is formed with alternating aluminum nitride and aluminum gallium nitride layers as shown in FIGS. 5-9. FIG. 5 shows one example, in which an epitaxial deposition process 500 is performed that deposits an initial aluminum nitride sublayer 108 over the top side of the aluminum nitride layer 106. In one example, the process 500 deposits the aluminum nitride sublayer 108 to a thickness of 10-25 nm and as temperature of 900-1100° C., including intrinsic carbon doping of approximately 1E17-1E19 atoms/cm$^3$ to form the first aluminum nitride sublayer 108. FIG. 6 shows formation of the first aluminum gallium nitride sublayer 109 over the first aluminum nitride sublayer 108 using an epitaxial deposition process 600 to complete the first sublayer pair of the first superlattice 107. In one example, the process 600 forms the aluminum gallium nitride sublayer with an aluminum concentration of 40-60% to a thickness of 15-35 nm and a process temperature of 900-1100° C., including carbon doping of approximately 1E17-1E19 atoms/cm$^3$ to form the first aluminum gallium nitride sublayer 109.

The first superlattice deposition in this example continues in FIGS. 7 and 8 to form the second aluminum nitride/aluminum gallium nitride sublayer pair 108, 109. FIG. 7 shows one example, in which an epitaxial deposition process 700 is performed that deposits the second aluminum nitride sublayer 108 over the first aluminum gallium nitride sublayer 109, for example, using process parameters as described above in connection with FIG. 5 to form the second aluminum nitride sublayer 108 to a thickness of 10-25 nm. FIG. 8 shows one example in which an epitaxial deposition process 800 is performed that deposits the second aluminum gallium nitride sublayer 109 over the second aluminum nitride sublayer 108, for example, using process parameters as described above in connection with FIG. 6 to form the second aluminum gallium nitride sublayer 109 to a thickness of 15-35 nm. The alternating epitaxial deposition processing continues in this fashion to form further aluminum nitride/aluminum gallium nitride sublayer pairs 108, 109, including an epitaxial deposition process 900 in FIG. 9 that deposits the final aluminum gallium nitride sublayer 109 to complete the first superlattice 107 at 304 in FIG. 3. In one example, the completed first superlattice 107 includes 33 pairs of alternating aluminum nitride sublayers 108 and aluminum gallium nitride sublayers 109 as shown in FIG. 9.

The method 300 continues at 306 with performing an epitaxial deposition process 1000 that forms an aluminum gallium nitride interlayer 110 over the first superlattice 107. The epitaxial process 1000 in one example is a continuation or modification of the earlier epitaxial deposition processing, for example, with no chamber change, no cooling and no reheating. In another example, for increased process margin, the deposition temperature is reduced by 20-50 C for the epitaxial deposition process 1000. FIG. 10 shows one example, in which an epitaxial deposition process 1000 is performed that deposits the aluminum gallium nitride layer 110 over the top aluminum gallium nitride sublayer 109 of the first superlattice 107. In one example, the process 1000 deposits the aluminum gallium nitride interlayer 110 with an aluminum concentration of 40-60% to a thickness of 10-100 nm at a process temperature of 1000-1100° C., including carbon doping of approximately 1E17-1E19 atoms/cm$^3$.

Figure 11:
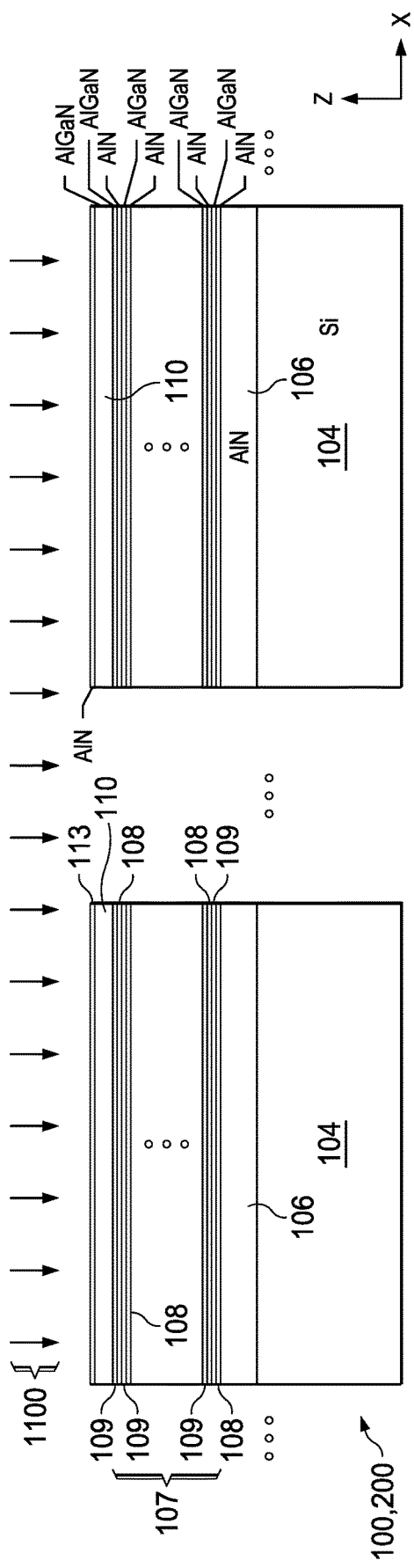
Figure 12:
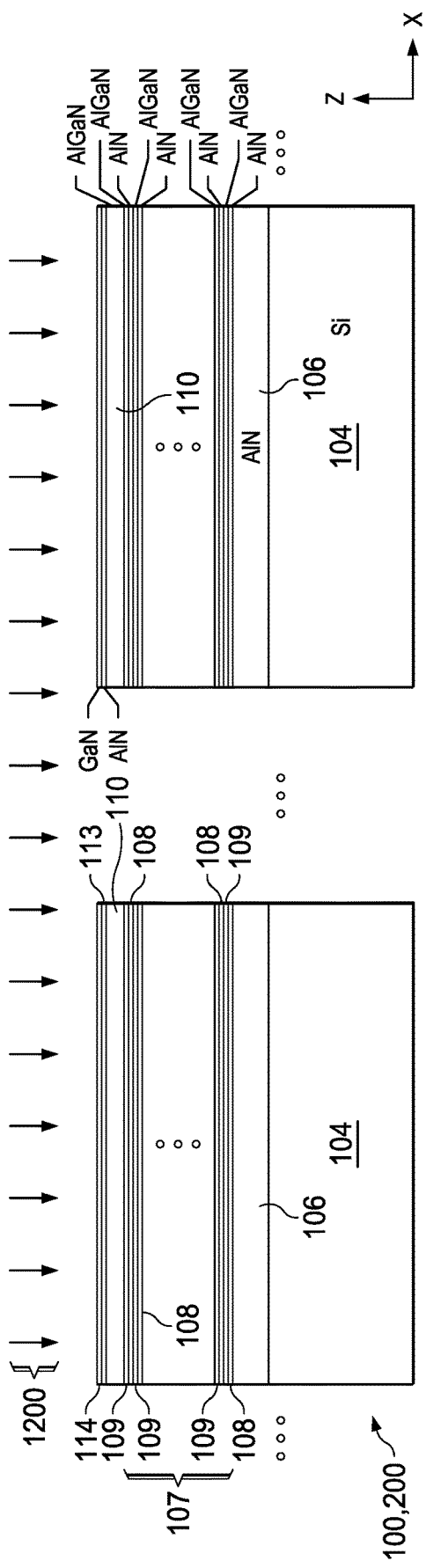

The method 300 continues at 308 with performing a third epitaxial deposition process that forms the second superlattice 112 over the aluminum gallium nitride interlayer 110, where the second superlattice 112 has alternating pairs of the aluminum nitride sublayers 112 and the gallium nitride sublayers 114. The second epitaxial deposition process at 308 can be a continuous process with changes of process parameters and materials between sublayers, or a series of separate deposition processes. FIG. 11 shows one example, in which the first aluminum nitride sublayer 113 is deposited over the top side of the aluminum gallium nitride interlayer 110 using an epitaxial deposition process 1100. In one example, the process 1100 deposits the aluminum nitride sublayer 113 to a thickness of 10-25 nm at a process temperature of 900-1100° C., including intrinsic carbon doping of approximately 1E16-1E18 atoms/cm$^3$. FIG. 12 shows formation of the first gallium nitride sublayer 114 over the first aluminum nitride sublayer 113 using an epitaxial deposition process 1200. In this example, the process 1200 deposits the gallium nitride sublayer 114 to a thickness of 15-35 nm at a process temperature of 900-1100° C., including carbon doping of approximately 1E18-1E20 atoms/cm$^3$. In one example, the carbon concentration is higher in the second superlattice 112 than in the first superlattice 107.

Figure 15:
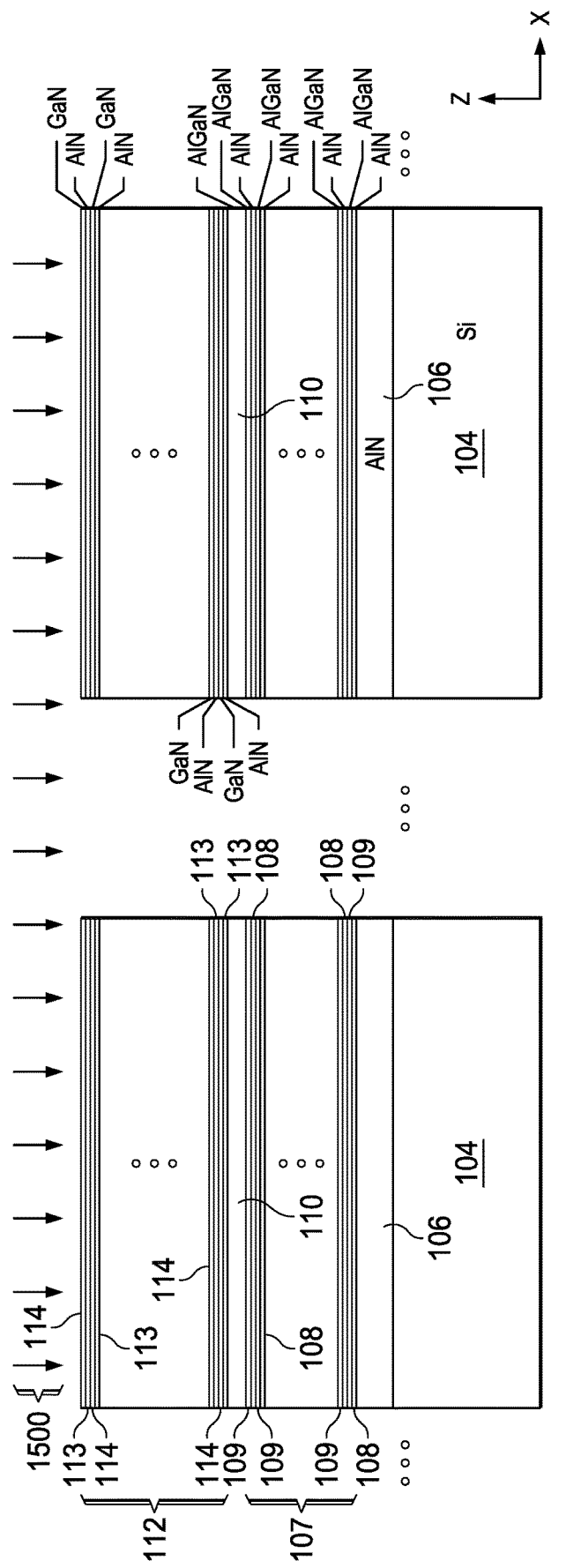

FIGS. 13 and 14 show epitaxial deposition processes 1300 and 1400 that respectively form the next pair of aluminum nitride and gallium nitride sublayers 113 and 114 of the second superlattice 112. The epitaxial deposition process 1300 in FIG. 13 deposits the second aluminum nitride sublayer 114 over the first gallium nitride sublayer 113, for example, using process parameters as described above in connection with FIG. 11 to form the second aluminum nitride sublayer 113 to a thickness of 10 to 25 nm. The epitaxial deposition process 1400 in FIG. 14 deposits the second gallium nitride sublayer 114, for example, using process parameters as described above in connection with FIG. 12 to form the second gallium nitride sublayer 114 to a thickness of 15-35 nm. The alternating epitaxial deposition processing continues in this fashion to form further aluminum nitride/gallium nitride sublayer pairs 113, 114, including an epitaxial deposition process 1500 in FIG. 15 that deposits the final gallium nitride sublayer 114 to complete the second superlattice 112 at 308 in FIG. 3. In one example, the completed second superlattice 112 includes 47 pairs of alternating aluminum nitride sublayers 113 and gallium nitride sublayers 114 as shown in FIG. 15.

Figure 16:
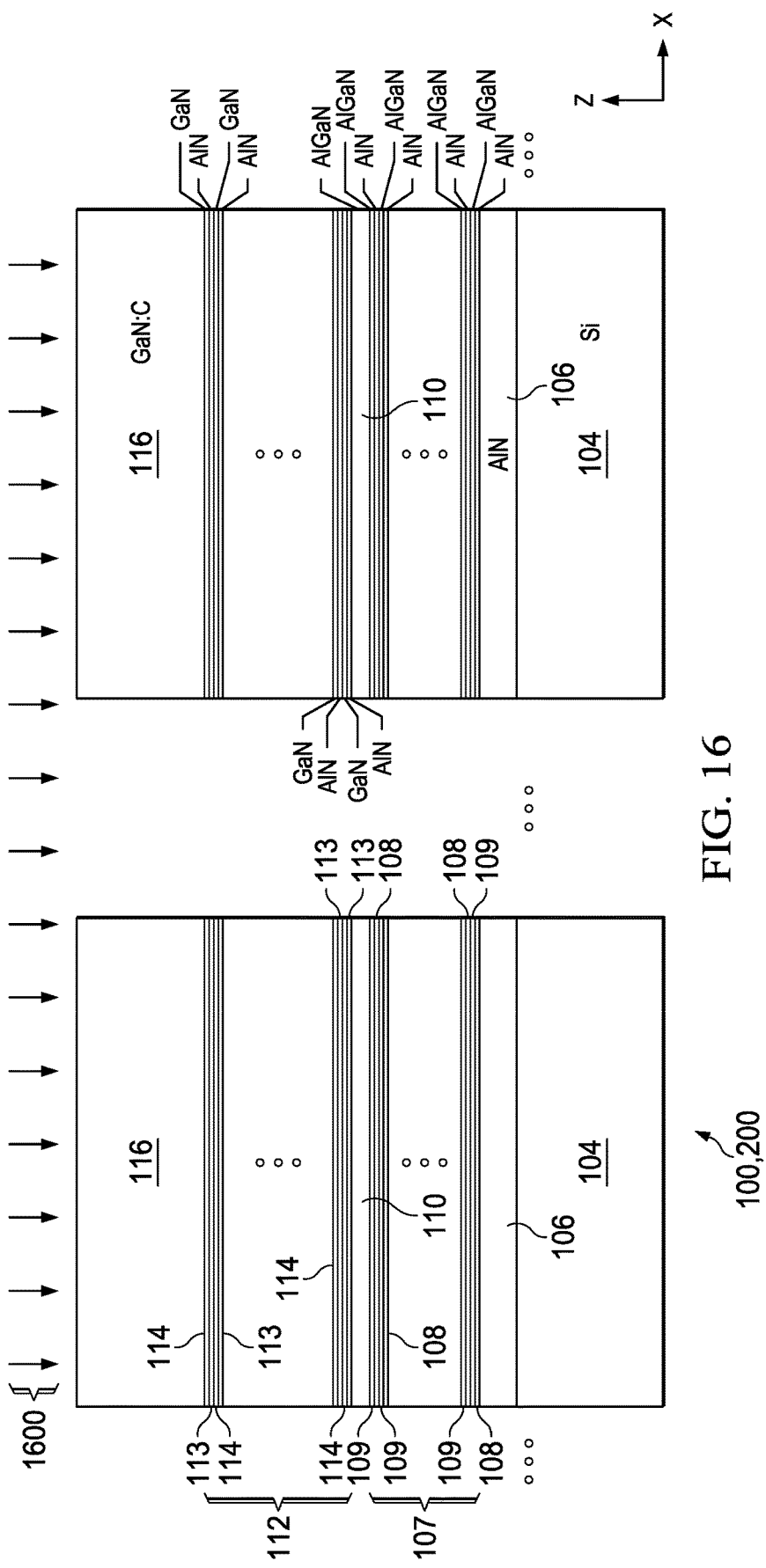

The method 300 continues at 310 with performing an epitaxial deposition process that deposits at least one layer of the buffer structure using an extrinsic carbon source gas. FIG. 16 shows one example, in which an epitaxial deposition process 1600 is performed that deposits the carbon doped gallium nitride layer 116 (GAN:C) over the top side of the final gallium nitride sublayer 114 of the second superlattice 112. In one example, the process 1600 deposits the carbon doped gallium nitride layer 116 to a thickness of 0.5-3.0 µm at a process temperature of 900-1050° C. using the extrinsic carbon doping with ethane (e.g., the extrinsic carbon source gas is or includes ethene $C_2H_4$ or $H_2C=CH_2$), or hexene or other extrinsic carbon source gas to provide the gallium nitride layer 116 with a carbon concentration of 1E18-1E20 atoms/cm$^3$. As previously mentioned, the use of the extrinsic carbon source gas at 310 facilitates enhanced carbon doping concentration in the gallium nitride layer 116 to mitigate current collapse, and facilitates uniform carbon concentration across the lateral extent of the processed wafer during fabrication, while still allowing relatively high temperature epitaxial growth to enhance the quality of the gallium nitride layer 116. In other implementations, other ones of the buffer layers or sublayers can be epitaxially deposited using an extrinsic carbon source gas to provide similar or further benefits with regard to current collapse and carbon concentration uniformity.

Figure 17:
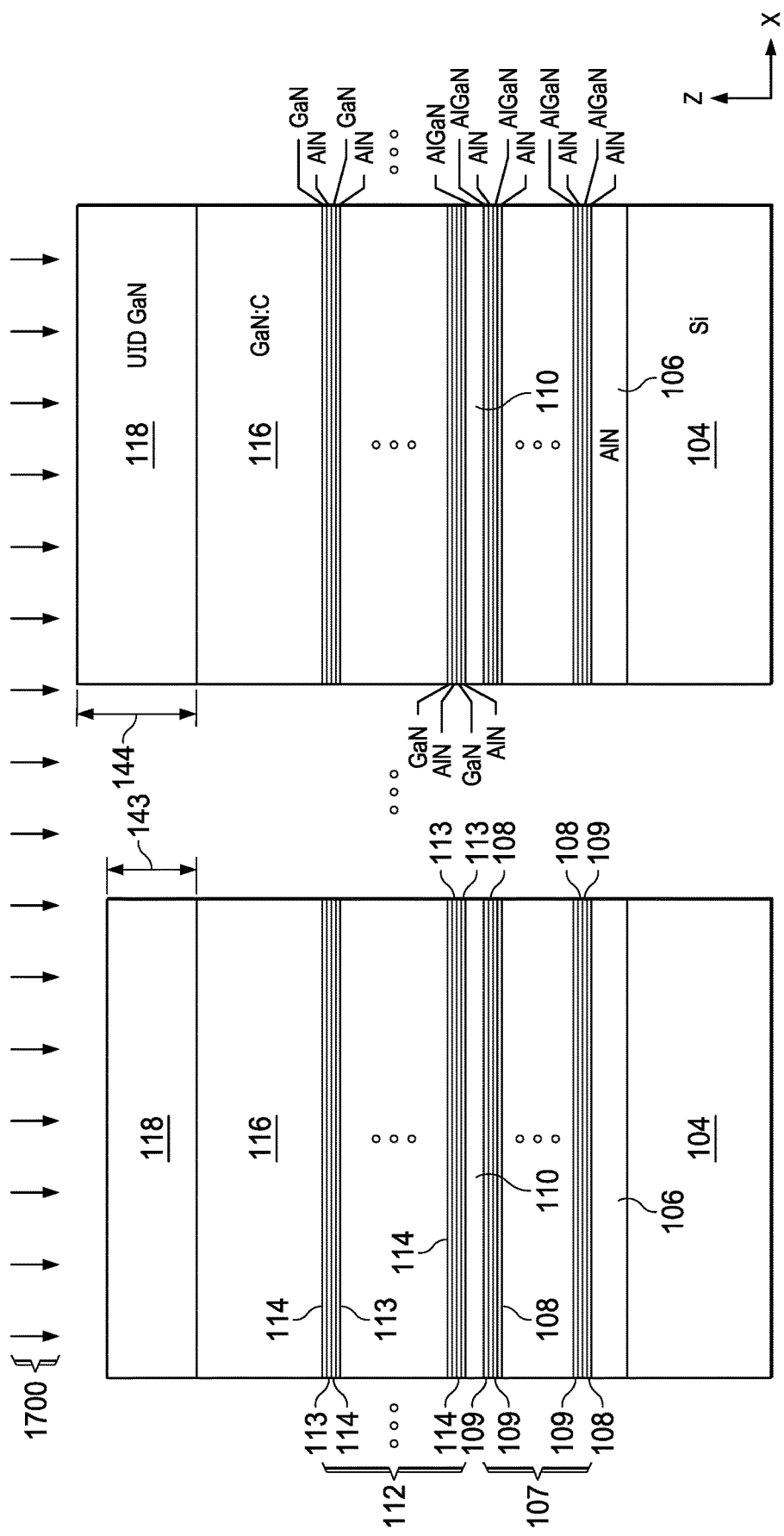

The method 300 continues at 312 in FIG. 3 with formation of the UID gallium nitride layer 118 over the top side of the carbon doped gallium nitride layer 116. FIG. 17 shows one example, in which an epitaxial deposition process 1700 is performed that deposits the gallium nitride layer 118 to a thickness 143 in the prospective depletion mode transistor region, and deposits the gallium nitride layer 118 to a thickness 144 in the enhancement mode transistor region of the electronic device 100, 200. In one example, the process 1700 deposits the gallium nitride layer 118 to a thickness of 0.1-0.5 µm at a process temperature of 950-1050° C., with carbon doping to a concentration of 1E15-1E17 atoms/cm$^3$.

Figure 18:
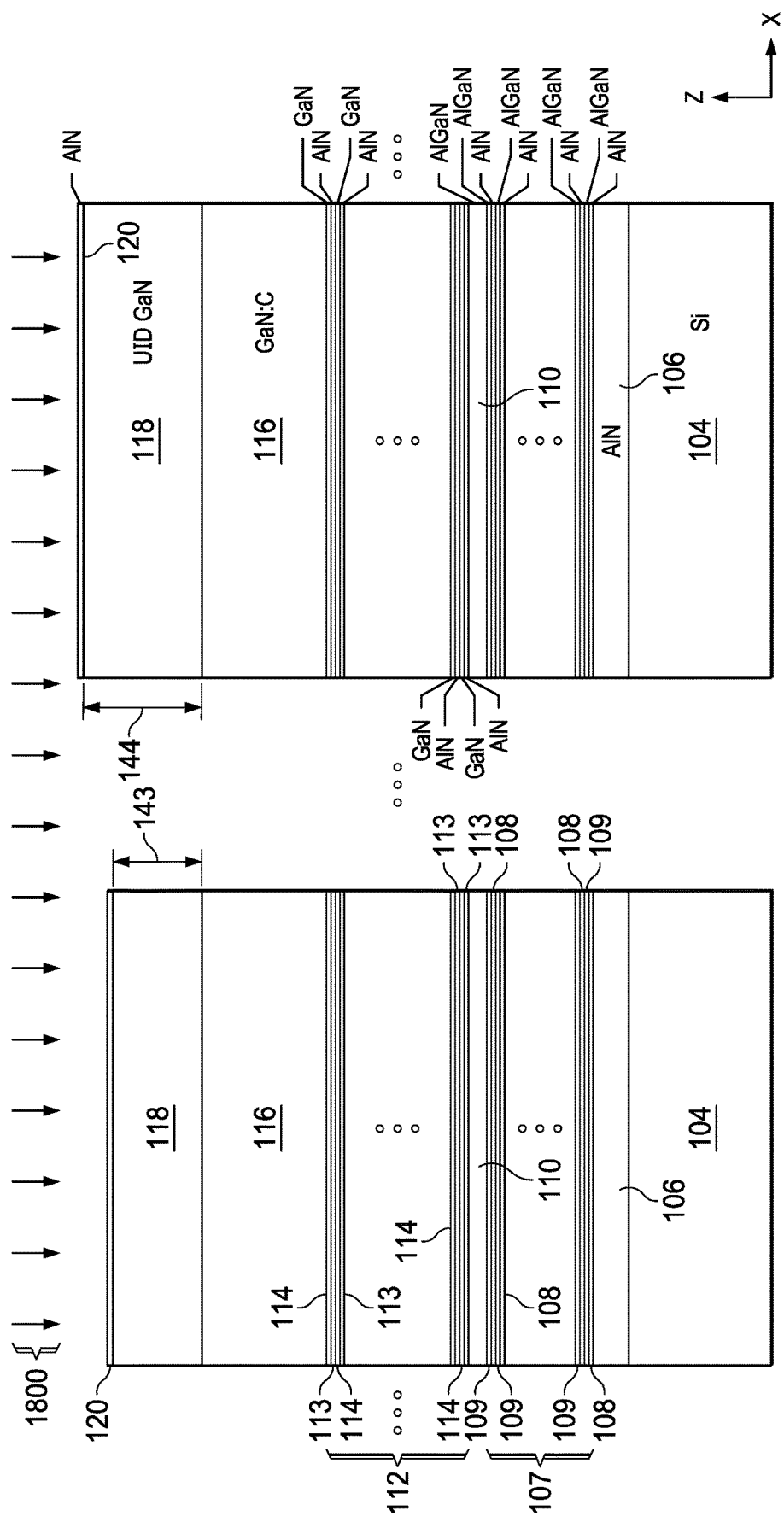
Figure 19:
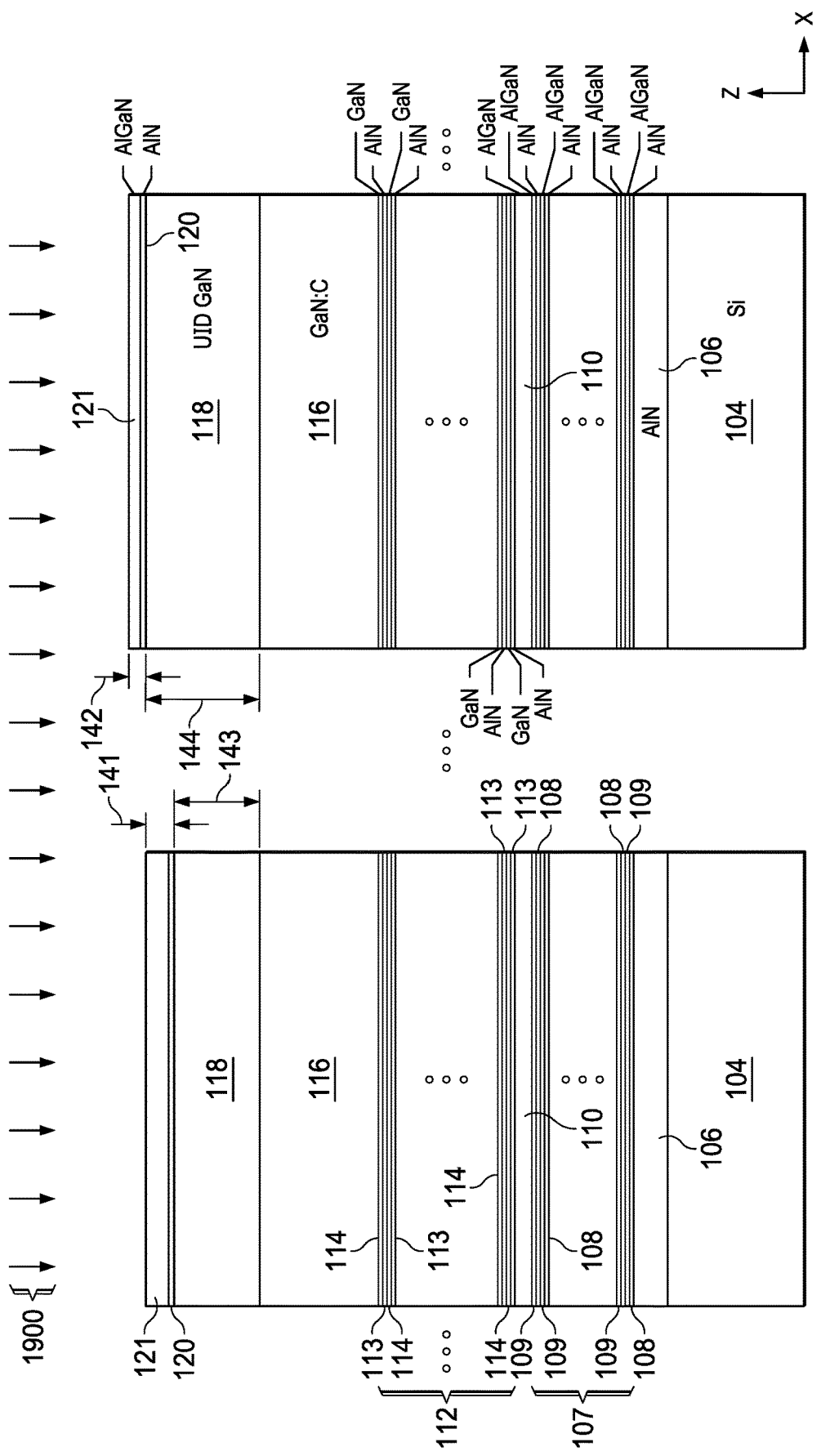

The method 300 continues at 314 with formation of the hetero-epitaxy structure 120, 121 over the buffer structure. This example includes forming the aluminum nitride layer 120 at 316 over the top side of the gallium nitride layer 118 using a process 1800 as shown in FIG. 18. In one example, the process 1800 deposits the aluminum nitride layer 120 to a thickness of about 10 Å at a process temperature of 900-1100° C. At 318, the aluminum gallium nitride layer 121 is formed over the aluminum nitride layer 120 using an epitaxial deposition process 1900 shown in FIG. 19. In one example, the process 1900 forms the aluminum gallium nitride layer 121 to a thickness of 10-30 nm at a process temperature of 900-1100° C. As shown in FIG. 19, moreover, the processing at 318 can include forming the aluminum gallium nitride layer 121 to different thicknesses for the depletion and enhancement mode transistor regions of the electronic device 100, 200.

Figure 20:
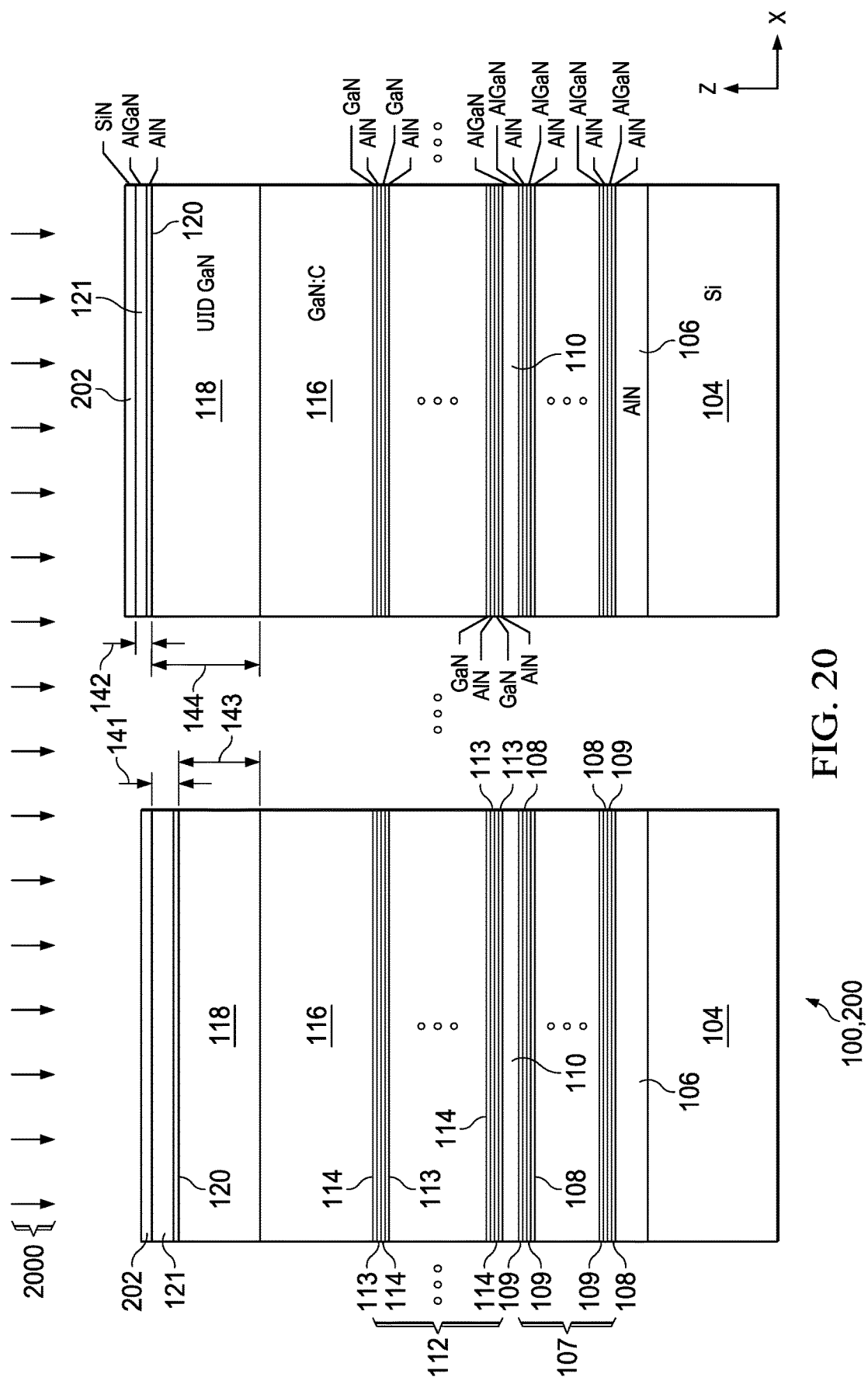

FIG. 3 illustrates one implementation that optionally includes forming a silicon nitride cap layer at 320 over the aluminum gallium nitride layer 121, for example, in fabricating the electronic device 200 of FIG. 2 above. In another example, the processing at 320 is omitted, for example, to fabricate the electronic device 100 of FIG. 1. FIG. 20 shows one example, in which the silicon nitride cap layer 202 is formed over the aluminum gallium nitride layer 121, for example, to a thickness of 2-20 nm at a process temperature of 900-1100° C. using a metal organic chemical vapor deposition (MOCVD) process 2000.

Figure 21:
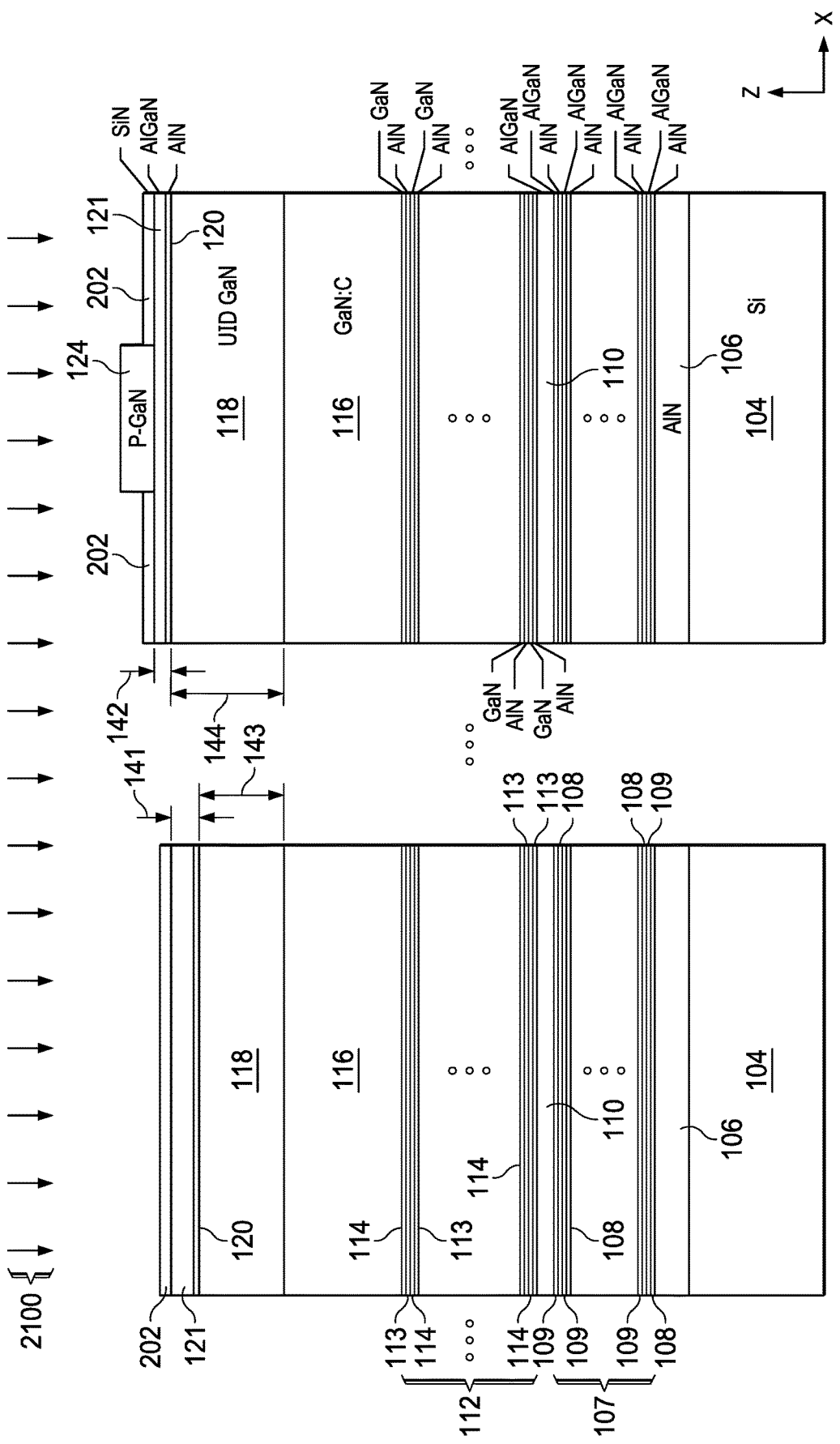

The method 300 in FIG. 3 further includes optionally forming a P-doped gallium nitride layer at 322 over the aluminum gallium nitride layer 121 for the gate of the enhancement mode transistor 102 in FIGS. 1 and 2. In other implementations, for example, where only a depletion mode transistor is to be formed, the processing at 322 is omitted. FIG. 21 shows one example, in which a process 2100 is performed that forms the P-doped gallium nitride layer 124 over a portion of the aluminum gallium nitride layer 121 for the gate of the enhancement mode transistor 102. The process 2100 can include deposition of a P-doped gallium nitride layer across the top of the wafer, followed by forming and patterning an etch mask that covers the prospective P-doped gallium nitride structure 124 in the enhancement mode transistor region of the wafer, and etching the exposed gallium nitride material to leave the patterned P-doped gallium nitride structure 124 as shown in FIG. 21.

The method 300 further also includes forming the gate, drain and source structures (e.g., 131, 132, 134, 135, 136 and 138 in FIGS. 1 and 2 above, as well as metallization and other backend processing at 324. In this manner, the process 300 includes forming one or both of the transistors 101 and/or 102 as shown in FIGS. 1 and 2 above, individually including a gate over the hetero epitaxy structure 120, 121, a drain partially in the hetero epitaxy structure 120, 121, and a source partially in the hetero-epitaxy structure 120, 121. This provides the structures shown in FIGS. 1 and 2 above, and the process 300 continues at 326 with wafer level testing (e.g., wafer probe). The process 300 further includes packaging at 328, for example, including singulating or separating individual died portions of a processed wafer, and packaging the individual dies using any suitable packaging structure, such as lead frames, molded structures, system on module packaging, chip on die packaging, substrates with conductive features, or combinations thereof to provide a finished electronic device, such as an integrated circuit that includes the transistors 101 and/or 102, alone or along with other circuits (not shown), or a packaged transistor electronic device including a single transistor component 101 or 102. FIG. 22 shows one example of the finished packaged electronic device 100, 200, including a molded or ceramic package structure 2200 with conductive leads for the example depletion mode GaN transistor drain 161, gate 162 and source 163. The method 300 in FIG. 3 further includes final device testing at 330.

Figure 23:
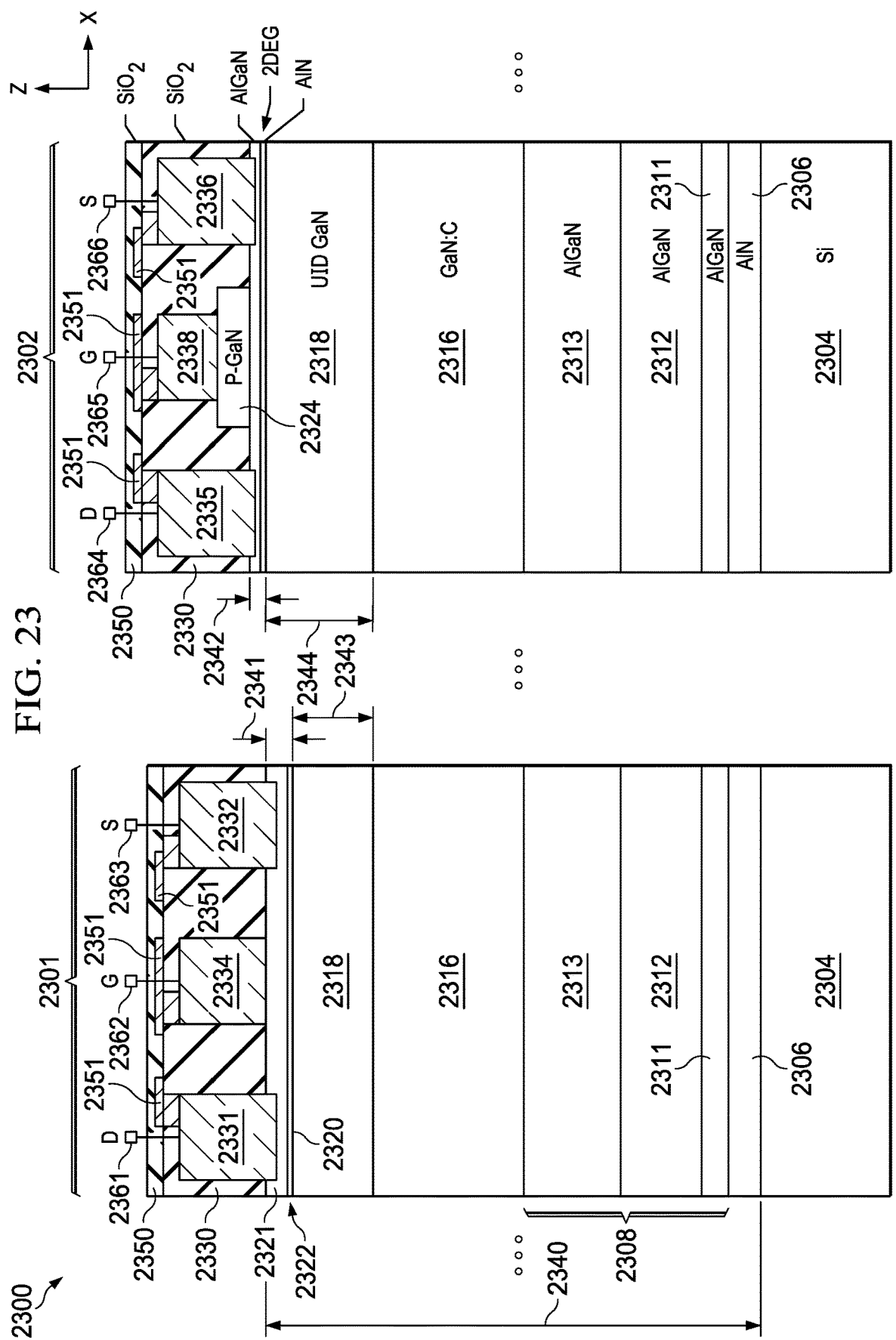
FIG. 23 is a partial sectional side elevation view of another electronic device with a depletion mode GaN transistor and an enhancement mode GaN transistor having extrinsically carbon doped buffer layers according to another aspect.
Figure 24:
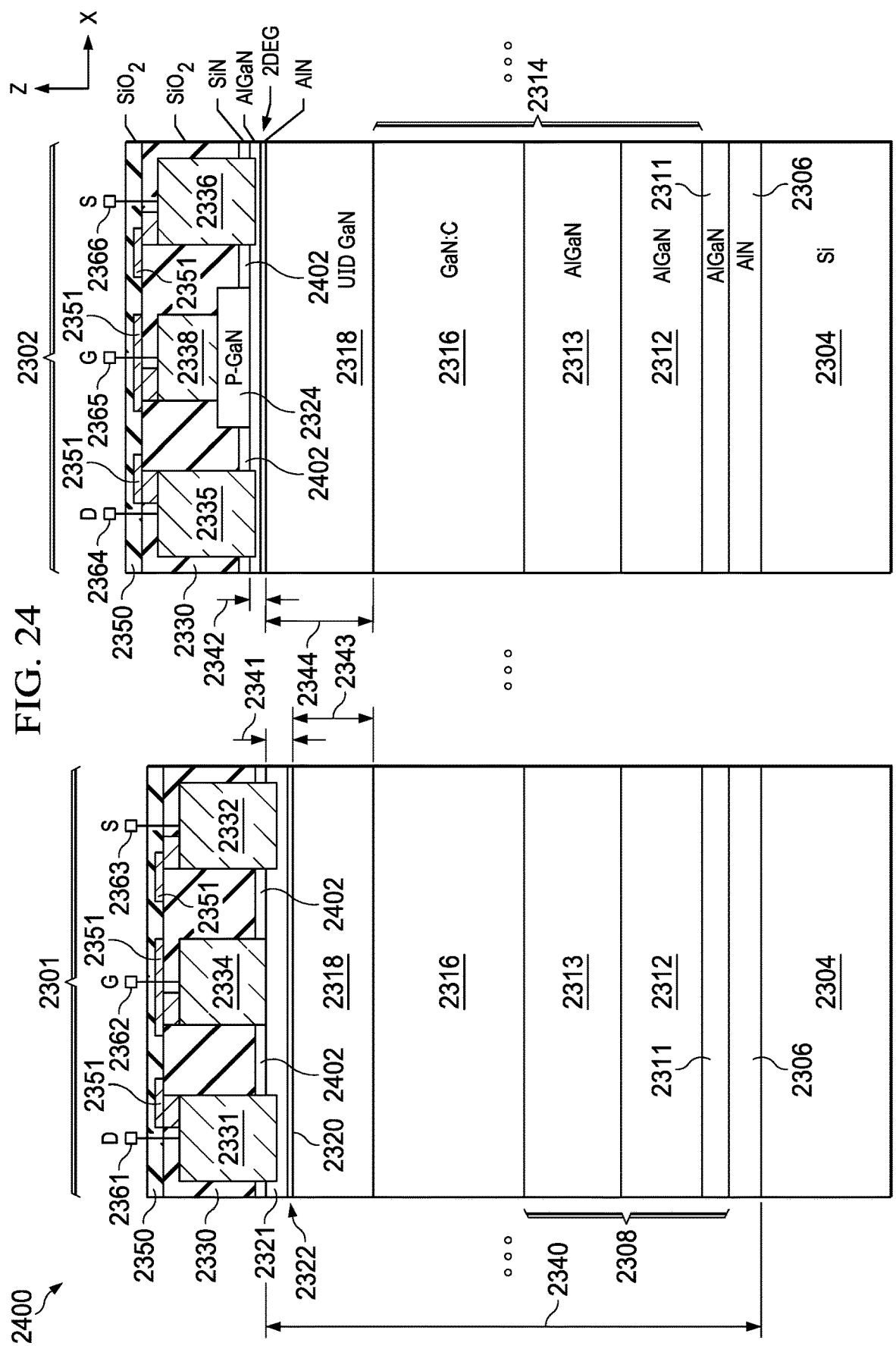
FIG. 24 is a partial sectional side elevation view of another electronic device with GaN transistors having extrinsically carbon doped buffer layers and a SiN cap layer according to another aspect.
Figure 25:
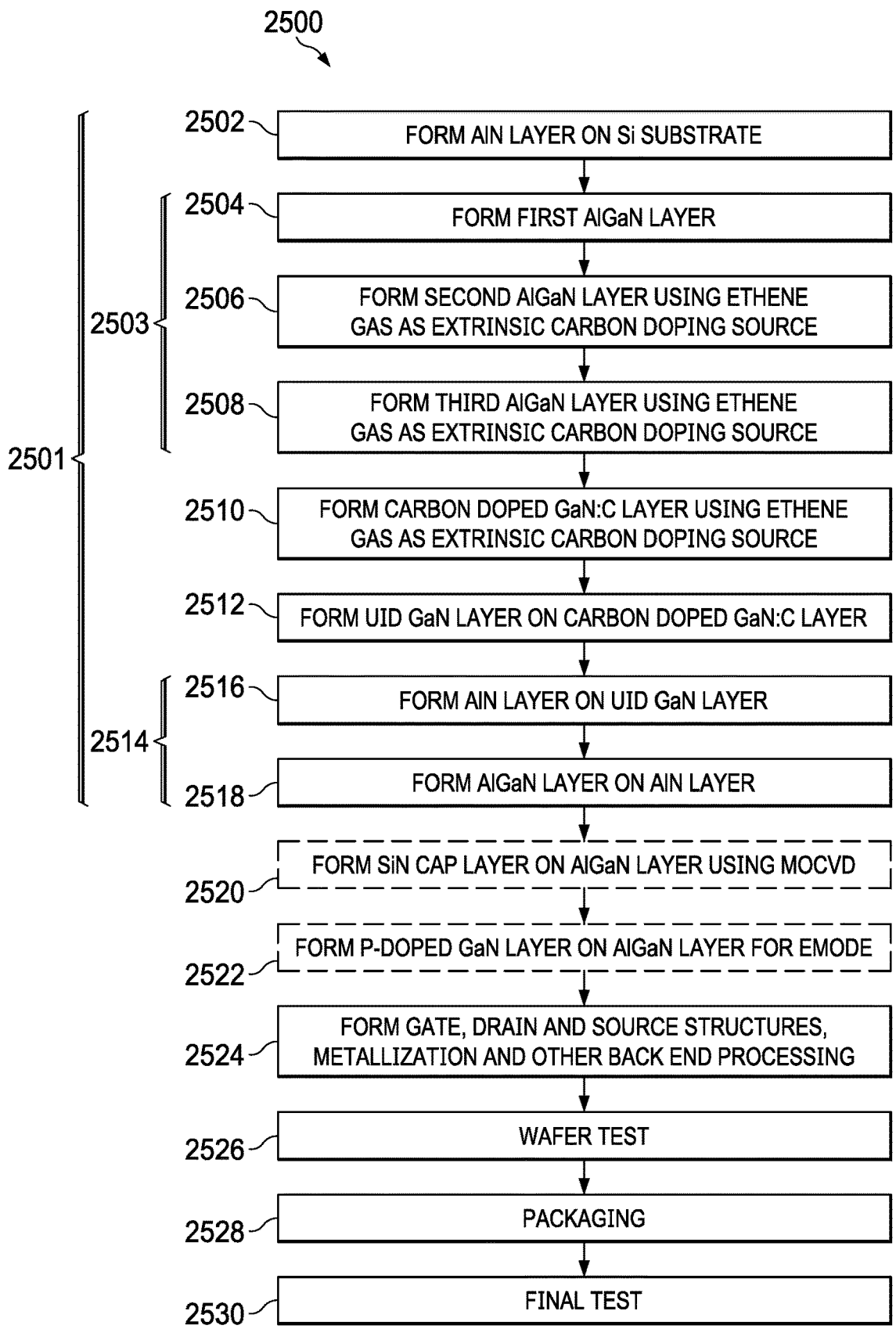
FIG. 25 is a flow diagram of a method for making an electronic device according to a further aspect.

Referring now to FIGS. 23-35, further aspects provide electronic devices and fabrication methods that include one or more extrinsically carbon doped buffer layers alone or in combination with a SiN cap layer. FIG. 23 shows a partial side view of another electronic device 2300 with a depletion mode GaN transistor 2301 and an enhancement mode GaN transistor 2302 having extrinsically carbon doped buffer layers according to another aspect, and FIG. 24 shows an electronic device 2400 with similar GaN transistors 2301 and 2302 with a SiN cap layer over a portion of a hetero-epitaxy structure. FIG. 25 shows an example method 2500 of making an electronic device according to a further aspect, FIGS. 26-35 show partial side views of the electronic device 2400 of FIG. 24 undergoing fabrication processing according to the method 2500 of FIG. 25.

The electronic device 2300 in FIG. 23 includes a substrate 2304, such as silicon (Si) or a silicon-on-insulator (SOI) structure of any suitable thickness along the illustrated vertical (Z) direction. The illustrated portion of the electronic device 2300 extends in a first lateral direction (X) as well as an orthogonal second lateral direction (a Y direction extending into and out of the page in FIG. 23).

The electronic device 2300 further includes a buffer structure having an aluminum nitride (AlN) layer 2306 and a multilayer composition graded aluminum gallium nitride stack 2308 over the aluminum nitride layer 2306. In one example, the aluminum nitride layer 2306 has a thickness of 300-600 nm. The multilayer composition graded aluminum gallium nitride stack 2308 in one example includes a first aluminum gallium nitride sublayer 2311 having a first aluminum concentration over an aluminum nitride layer 2306 of the buffer structure, a second aluminum gallium nitride sublayer 2312 having a second aluminum concentration that is less than the first aluminum concentration over the first aluminum gallium nitride sublayer 2311, and a third aluminum gallium nitride sublayer 2313 having a third aluminum concentration that is less than the second aluminum concentration over the second aluminum gallium nitride sublayer 2312. In one example, the first aluminum concentration is 60-70%, the second aluminum concentration is 40-50%, and the third aluminum concentration is 20-30%. In one example, the first aluminum gallium nitride sublayer 2311 has a thickness of 300-600 nm, the second aluminum gallium nitride sublayer 2312 has a thickness of 1.4-1.8 µm, and the third aluminum gallium nitride sublayer 2311 has a thickness of 1.4-2.0 µm.

The electronic device 2300 further includes a carbon doped gallium nitride layer 2316 (e.g., labeled "GaN:C" in the figures) over the multilayer composition graded aluminum gallium nitride stack 2308, and a gallium nitride layer 2318 (e.g., labeled "UID GaN") over the carbon doped gallium nitride layer 2316. In one example, the carbon doped gallium nitride layer 2316 has a thickness of 0.5-2.0 µm. In this or another example, the gallium nitride layer 2318 has a thickness of 0.1-0.5 µm. In one implementation, the gallium nitride layer 2318 includes carbon. In one example, the gallium nitride layer 2318 has a carbon doping concentration of about 2E16 atoms/cm$^3$ (e.g., $2 \times 10^{16}$ atoms*cm$^{-3}$) that is nearly three orders of magnitude lower than that of the underlying carbon doped gallium nitride layer 2316 (e.g., about 1E19 atoms/cm$^3$ or $1 \times 10^{19}$ atoms*cm$^{-3}$).

The electronic device 2300 also includes a hetero-epitaxy structure having an aluminum nitride layer 2320 over the gallium nitride layer 2318, and an aluminum gallium nitride layer 2321 over the aluminum nitride layer 2320. The hetero junction at the interface between the aluminum gallium nitride layer 2321 and the aluminum nitride layer 2320 forms a two-dimensional electron gas region 2322 (e.g., labeled "2DEG"). In one example, the hetero-epitaxy structure, including the layers 2320 and 2321 has a total thickness of 10-30 nm. The electronic device 2300 also includes one or more transistors, including the depletion mode transistor 2301, and the enhancement mode transistor 2302 in the illustrated implementation. The electronic device 2300 includes a p-doped gallium nitride layer 2324 over the aluminum gallium nitride layer 2321 of the hetero-epitaxy structure 2320, 2321 for the gate of the enhancement mode transistor 2302. In one example, the p-doped gallium nitride layer 2324 includes magnesium dopants and has a thickness of 50-200 nm, such as about 70 nm in one implementation.

The electronic device 2300 further includes a metallization structure with a first pre-metal dielectric (e.g., PMD) layer 2330, for example, including silicon nitride or silicon dioxide, with various conductive metal structures formed therein, including a depletion mode transistor drain contact or electrode 2331, a depletion mode transistor source contact or electrode 2332, a depletion mode transistor gate contact or electrode 2334, an enhancement mode transistor drain contact or electrode 2335, an enhancement mode transistor source contact or electrode 2336, an enhancement mode transistor gate contact or electrode 2338, and one or more conductive vias provide an electrical interconnection of various transistor terminals for routing in a second metallization structure level.

The various buffer layers and layers of the hetero-epitaxy structure are fabricated in one example using epitaxial growth deposition processing, for example, a continuous epitaxial deposition process with variables and materials changed throughout form the constituent layers and/or two or more sequential epitaxial deposition processes, with a total thickness 2340 of approximately 5.1 µm in one example. In the depletion mode transistor 2301, the hetero-epitaxy structure including the layers 2320 and 2321 has a total thickness 2341 of approximately 10-30 nm, and the hetero-epitaxy structure in the enhancement mode transistor 2302 has a total thickness 2342 of approximately 10-20 nm. The aluminum nitride layer 2320 in one example has a thickness of approximately 10 Å, and the aluminum gallium nitride layer 2321 has a thickness of approximately 20 nm in the depletion mode transistor 2301. The gallium nitride layer 2321 in the enhancement mode transistor 2302 has a smaller thickness. In the illustrated example, the gallium nitride layer 2318 has a thickness 2343 in the depletion mode transistor 2301 of approximately 0.1-0.5 µm, and the gallium nitride layer 2318 in the enhancement mode transistor 2302 has a thickness 2344 of approximately 0.45 µm. In the illustrated example, the aluminum gallium nitride layer 2321 in the depletion mode transistor 2301 has a thickness of about 20 nm and an aluminum concentration of about 26%, and the aluminum gallium nitride layer 2321 in the enhancement mode transistor 2302 has a thickness of about 10-20 nm and an aluminum concentration of about 20-25%. In another example, the aluminum gallium nitride layer 2321 in the enhancement mode transistor 2302 has a thickness of about 17 nm and an aluminum concentration of about 20%.

The electronic device 2300 in FIG. 23 further includes a second metallization structure level with a dielectric layer 2350 (e.g., silicon nitride of silicon dioxide) having one or more conductive routing features 2351 (e.g., aluminum, copper, etc.), for example, to provide routing of drain, source and gate connections and associated signals to one another and/or to conductive bond pads, or other externally exposed conductive features by which the transistors 2301 and 2302 can be electrically interconnected with other circuitry, for example, using bond wires or lead frame electrical connections to integrated circuit leads, such as pins or pads in a packaged electronic device, as illustrated below in the example packaged electronic device of FIG. 22.

The depletion mode transistor 2301 includes a gate 2362 (e.g., labeled "G") over the aluminum gallium nitride layer 2321 of the hetero-epitaxy structure 2320, 2321, a drain 2361 (e.g., labeled "D") partially in the aluminum gallium nitride layer 2321 of the hetero-epitaxy structure 2320, 2321 and spaced apart from the gate 2362 along the lateral X direction. The depletion mode transistor 2301 also includes a source 2363 (e.g., labeled "S") partially in the aluminum gallium nitride layer 2321 of the hetero-epitaxy structure 2320, 2321, where the source 2363 is spaced apart from the gate 2362 and from the drain 2361 in the lateral X direction. The enhancement mode transistor 2302 includes a gate 2365 (e.g., labeled "G") over the p-doped gallium nitride layer 2324, a drain 2364 (e.g., labeled "D") partially in the aluminum gallium nitride layer 2321 of the hetero-epitaxy structure 2320, 2321, where the drain 2364 is spaced apart from the gate 2365 along the lateral X direction. The enhancement mode transistor 2302 also includes a source 2366 (e.g., labeled "S") partially in the aluminum gallium nitride layer 2321 of the hetero-epitaxy structure 2320, 2321, where the source 2366 is spaced apart from the gate 2365 and from the drain 2364 along the lateral X direction.

FIG. 24 shows another electronic device 2400 with GaN transistors 2301 and 2302 having extrinsically carbon doped buffer layers, multilayer composition graded aluminum gallium nitride stack 2308 over the aluminum nitride layer 2306, and a SiN cap layer 2402 according to another aspect. The electronic device 2400 in this example includes similarly numbered structures and features as described above in connection with FIG. 23. In addition, the electronic device 2400 further includes the silicon nitride cap layer 2402 over the aluminum gallium nitride layer 2321 of the hetero-epitaxy structure 2320, 2321. In one example, the silicon nitride cap layer 2402 has a thickness of 2-10 nm. The silicon nitride cap layer 2402 in the electronic device 2400 of FIG. 24 acts as a surface passivation layer that protects the surface of the top aluminum gallium nitride layer 2321 from the post-epitaxial processing, thereby mitigating or avoiding micro pitting and leakage problems. In addition, the carbon content of the carbon doped gallium nitride layer 2316 (GaN:C) helps mitigate current collapse in operation of the transistors 2301 and 2302 and provides carbon content uniformity across a wafer during fabrication, leading to improved production yield and reduced cost. As discussed further below in connection with FIG. 25, moreover, the carbon doped gallium nitride layer 2316 in one example is fabricated using an extrinsic carbon source, for example, a controllable hydrocarbon such as ethene or hexene gas flow during epitaxial deposition, to allow the epitaxial gallium nitride growth at a higher temperature for better gallium nitride layer quality, while providing generally temperature independent control of the carbon doping for improved current collapse performance at the lateral center and edge regions of a processed wafer without tradeoff in layer quality.

Referring now to FIGS. 25-35, FIG. 25 shows an example method 2500 of making an electronic device according to a further aspect, and FIGS. 26-35 show partial side views of the electronic device 2400 of FIG. 24 undergoing fabrication processing according to the method of FIG. 25. The method 2500 also includes example acts and events that can be used in fabricating the electronic device 2300 of FIG. 23. The method 2500 begins with a starting substrate, such as a silicon wafer, an SOI wafer, etc. An epitaxial deposition process or multiple epitaxial deposition processes are performed at 2501, including forming the buffer structure 2308, 2316 and 2318 in FIGS. 23 and 24 over the substrate 2304.

Figure 26:
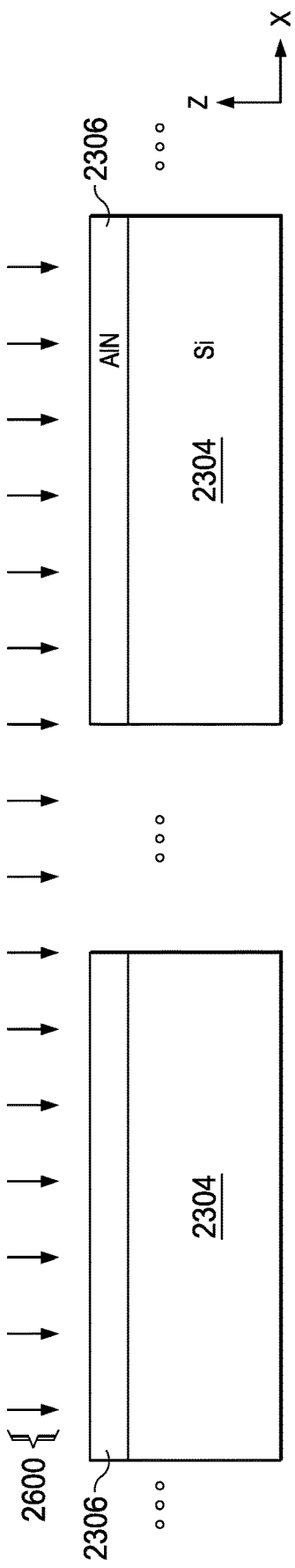

An aluminum nitride layer is formed over the substrate at 2502. FIG. 26 shows one example, in which the aluminum nitride layer 2306 in the above electronic devices 2300 and 2400 is deposited over an upper surface of the silicon substrate 2304 using an epitaxial deposition process 2600. In one example, the process 2600 includes depositing aluminum nitride at a temperature of 1000-1150° C. to a thickness of 300-600 nm.

Figure 27:
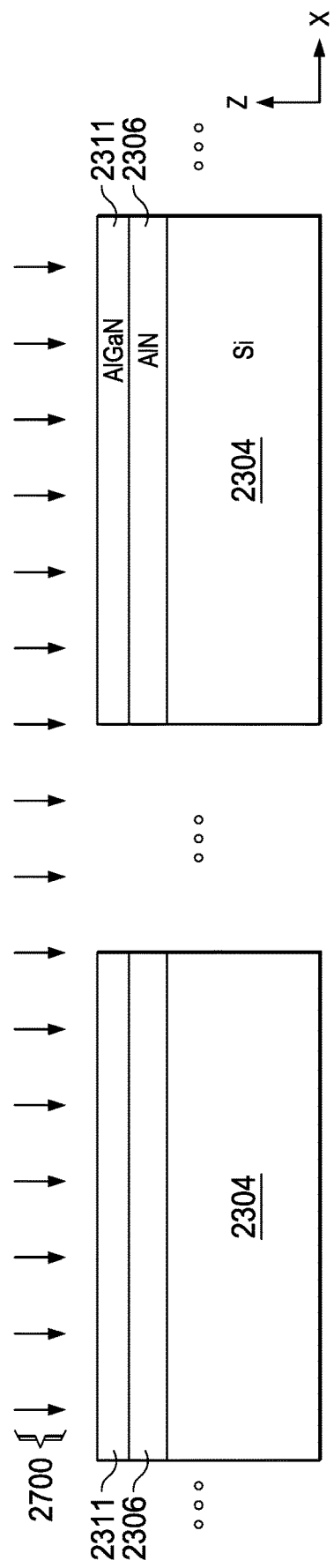
Figure 30:
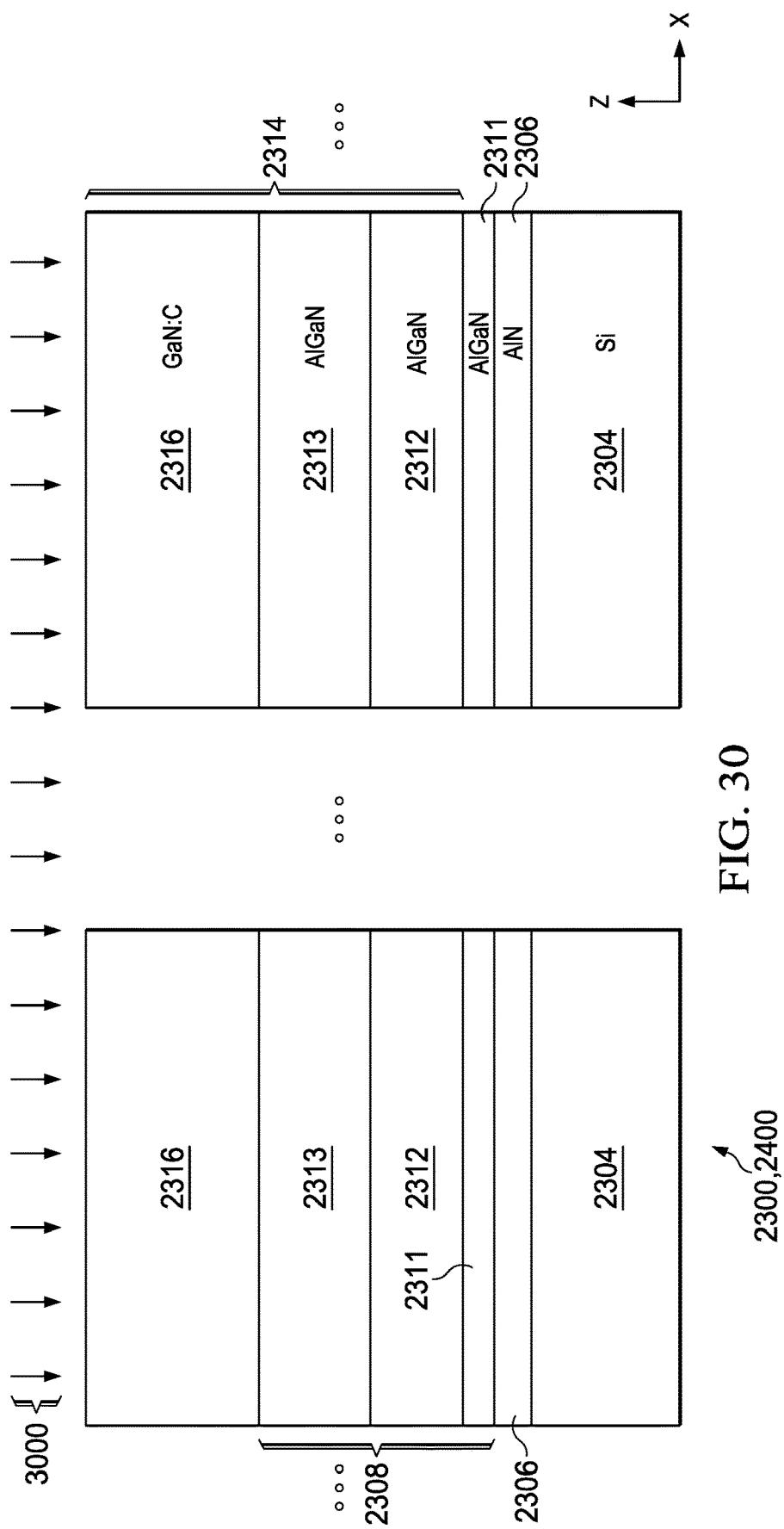

The buffer formation continues at 2503 with forming the multilayer composition graded aluminum gallium nitride stack 2308 over the aluminum nitride layer 2306. The composition graded aluminum gallium nitride stack formation at 2503 in one example includes performing a first epitaxial deposition process at 2504 that forms a first aluminum gallium nitride sublayer over the aluminum nitride layer 2306. FIG. 27 shows one example, in which an epitaxial deposition process 2700 is performed that deposits the first aluminum gallium nitride sublayer 2311 over the aluminum nitride layer 2306. In one example, the process 2700 deposits the first aluminum gallium nitride sublayer 2311 with an aluminum content of 60-70% to a thickness of 300-600 nm at a process temperature of 900-1100° C. In one implementation, moreover, the process 2700 uses ethane, hexane or other extrinsic carbon source gas to form the first aluminum gallium nitride sublayer 2311 with a carbon concentration of 1E17-1E18 atoms/cm$^3$.

The method 2500 continues at 2506 with performing a second epitaxial deposition process that forms the second aluminum gallium nitride sublayer 2312 over the first aluminum gallium nitride sublayer 2311. FIG. 28 shows one example, in which a second epitaxial deposition process 2800 is performed that deposits the second aluminum gallium nitride sublayer 2312 with an aluminum content of 40-50% to a thickness of 1.4-1.8 μm using a process temperature of 900-1100° C. In one implementation, moreover, the process 2800 uses ethane, hexane or other extrinsic carbon source gas to form the second aluminum gallium nitride sublayer 2312 with a carbon concentration of 1E17-1E19 atoms/cm$^3$.

The method 2500 continues at 2508 with performing a third epitaxial deposition process that forms the third aluminum gallium nitride sublayer 2313 over the second aluminum gallium nitride sublayer 2312. FIG. 29 shows one example, in which a third epitaxial deposition process 2900 is performed that deposits the third aluminum gallium nitride sublayer 2313 with an aluminum content of 20-30% to a thickness of 1.4-2.0 μm using a process temperature of 1000-1100° C. In one implementation, moreover, the process 2900 uses ethane, hexane or other extrinsic carbon source gas to form the third aluminum gallium nitride sublayer 2313 with a carbon concentration of 1E17-1E19 atoms/cm$^3$.

The method 2500 continues at 2510 with performing an epitaxial deposition process that deposits a gallium nitride layer using an extrinsic carbon source gas. FIG. 16 shows one example, in which an epitaxial deposition process 3000 is performed that deposits the carbon doped gallium nitride layer 2316 (GAN:C) over the top side of the final gallium nitride sublayer 2313 of the multilayer composition graded aluminum gallium nitride stack 2308. In one example, the process 3000 deposits the carbon doped gallium nitride layer 2316 to a thickness of 1.0-2.5 μm at a process temperature of 900-1050° C. using hexane or other extrinsic carbon gas to provide the gallium nitride layer 2316 with a carbon concentration of 1E18-1E20 atoms/cm$^3$. As previously mentioned, the use of the extrinsic carbon source gas at 2510 facilitates enhanced carbon doping concentration in the gallium nitride layer 2316 to mitigate current collapse, and facilitates uniform carbon concentration across the lateral extent of the processed wafer during fabrication, while still allowing relatively high temperature epitaxial growth to enhance the quality of the gallium nitride layer 2316. In other implementations, other ones of the buffer layers or sublayers can be epitaxially deposited using an extrinsic carbon source gas to provide similar or further benefits with regard to current collapse and carbon concentration uniformity.

Figure 31:
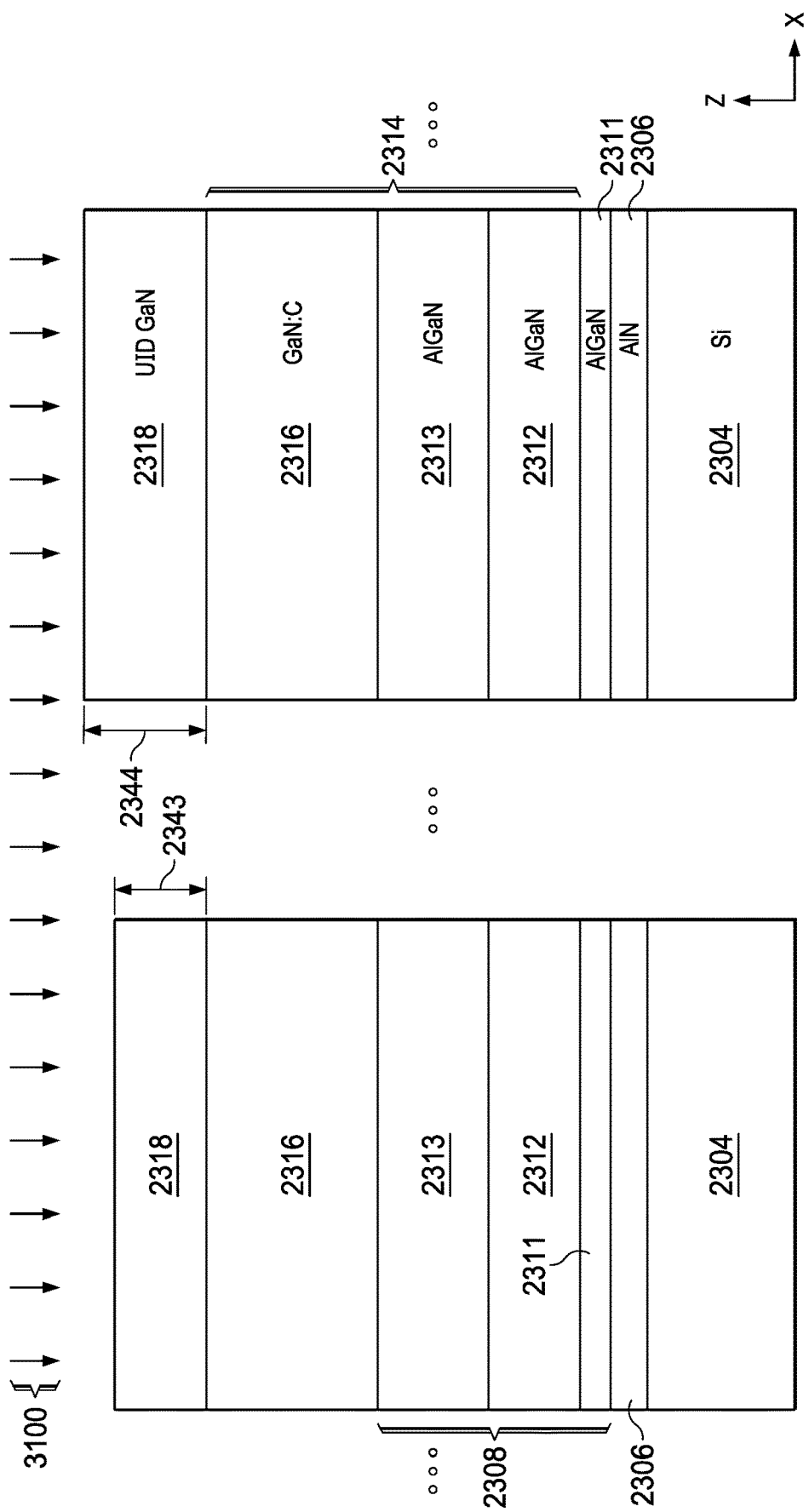

The method 2500 continues at 2512 in FIG. 25 with formation of the UID gallium nitride layer 2318 over the top side of the carbon doped gallium nitride layer 2316. FIG. 31 shows one example, in which an epitaxial deposition process 3100 is performed that deposits the gallium nitride layer 2318 to a thickness 2343 in the prospective depletion mode transistor region. In one example, the process 3100 deposits the gallium nitride layer 2318 to a thickness 2344 in the enhancement mode transistor region of the electronic device 2300, 2400. In one example, the process 3100 deposits the gallium nitride layer 2318 to a thickness of 0.1-0.5 μm at a process temperature of 950-1050° C., with intrinsic carbon doping to a concentration of 1E15-1E17 atoms/cm$^3$.

Figure 32:
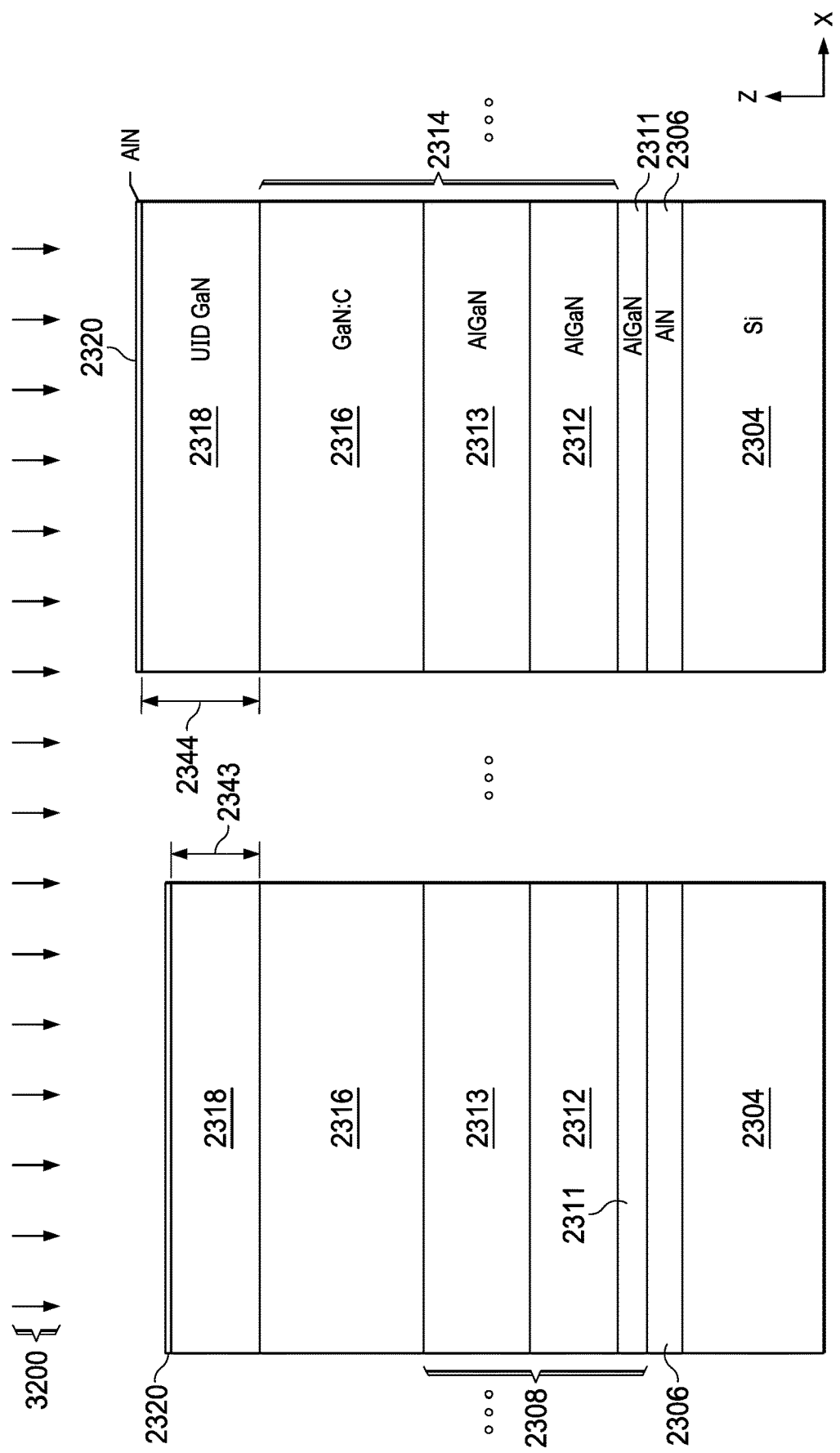
Figure 33:
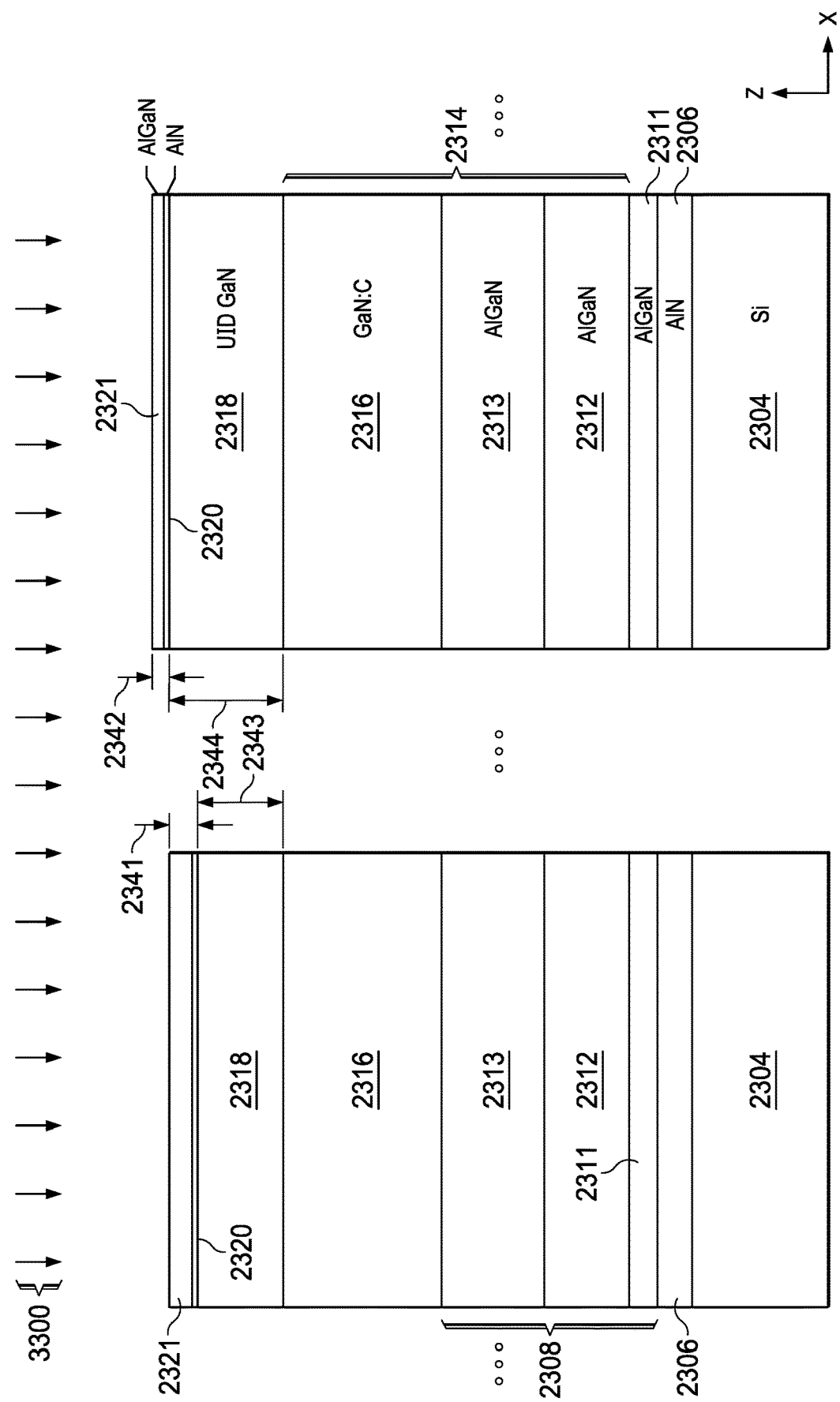

The method 2500 continues at 2514 with formation of the hetero-epitaxy structure 2320, 2321 over the buffer structure. This example includes forming the aluminum nitride layer 2320 at 2516 over the top side of the gallium nitride layer 2318 using a process 3200 as shown in FIG. 32. In one example, the process 3200 deposits the aluminum nitride layer 2320 to a thickness of about 10 Å at a process temperature of 900-1100° C. At 2518, the aluminum gallium nitride layer 2321 is formed over the aluminum nitride layer 2320 using an epitaxial deposition process 3300 shown in FIG. 33. In one example, the process 3300 forms the aluminum gallium nitride layer 2321 to a thickness of 10-30 nm at a process temperature of 900-1100° C. As shown in FIG. 33, moreover, the processing at 2518 can include forming the aluminum gallium nitride layer 2321 to different thicknesses for the depletion and enhancement mode transistor regions of the electronic device 2300, 2400.

Figure 34:
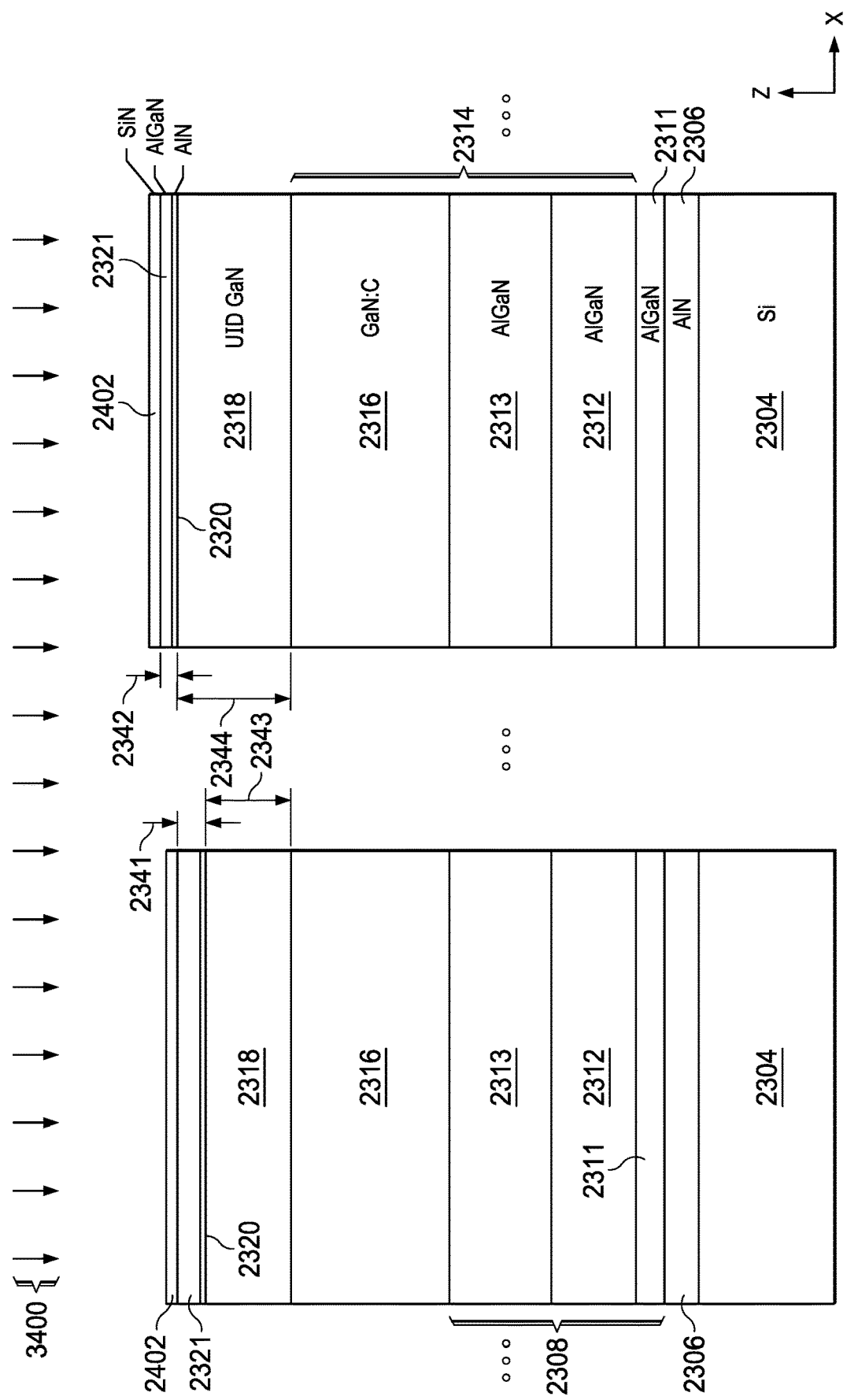

FIG. 25 illustrates one implementation that optionally includes forming a silicon nitride cap layer at 2520 over the aluminum gallium nitride layer 2321, for example, in fabricating the electronic device 2400 of FIG. 24. In another example, the processing at 2520 is omitted, for example, to fabricate the electronic device 2300 of FIG. 23. FIG. 34 shows one example, in which the silicon nitride cap layer 2402 is formed over the aluminum gallium nitride layer 2321, for example, to a thickness of 2-20 nm at a process temperature of 900-1100° C. using a metal organic chemical vapor deposition (MOCVD) process 3400.

Figure 35:
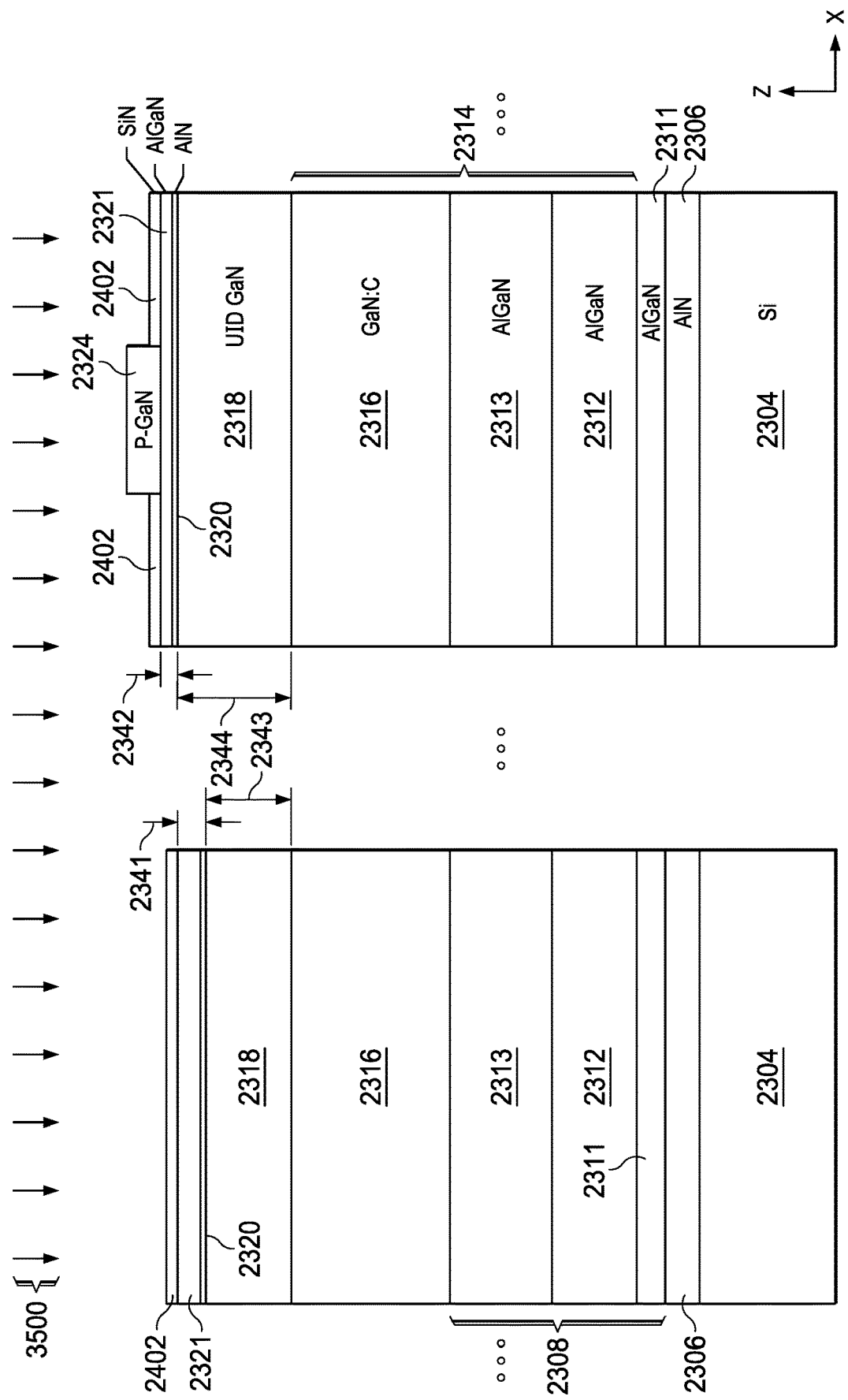

The method 2500 in FIG. 25 further includes optionally forming a P-doped gallium nitride layer at 2522 over the aluminum gallium nitride layer 2321 for the gate of the enhancement mode transistor 2302 in FIGS. 23 and 24. In other implementations, for example, where only a depletion mode transistor is to be formed, the processing at 2522 is omitted. FIG. 35 shows one example, in which a process 3500 is performed that forms the P-doped gallium nitride layer 2324 over a portion of the aluminum gallium nitride layer 2321 for the gate of the enhancement mode transistor 2302. The process 3500 can include deposition of a P-doped gallium nitride layer across the top of the wafer, followed by forming and patterning an etch mask that covers the prospective P-doped gallium nitride structure 2324 in the enhancement mode transistor region of the wafer, and etching the exposed gallium nitride material to leave the patterned P-doped gallium nitride structure 2324 as shown in FIG. 35.

The method 2500 further also includes forming the gate, drain and source structures (e.g., 23323, 2332, 2334, 2335, 2336 and 2338 in FIGS. 23 and 24 above, as well as metallization and other backend processing at 2524. In this manner, the process 2500 includes forming one or both of the transistors 2301 and/or 2302 as shown in FIGS. 23 and 24 above, individually including a gate over the hetero epitaxy structure 2320, 2321, a drain partially in the hetero epitaxy structure 2320, 2321, and a source partially in the hetero-epitaxy structure 2320, 23223. This provides the structures shown in FIGS. 23 and 24 above, and the process 2500 continues with wafer level testing (e.g., wafer probe) at 2526. The process 2500 further includes packaging at 2528, for example, including singulating or separating individual died portions of a processed wafer, and packaging the individual dies using any suitable packaging structure, such as lead frames, molded structures, system on module packaging, chip on die packaging, substrates with conductive features, or combinations thereof to provide a finished electronic device, such as an integrated circuit that includes the transistors 2301 and/or 2302, alone or along with other circuits (not shown), or a packaged transistor electronic device including a single transistor component 2301 or 2302. The method 2500 also includes final device testing at 2530.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:
1. An electronic device, comprising:
a substrate;
a buffer structure over the substrate;
a hetero-epitaxy structure over the buffer structure; and
a transistor having a gate over the hetero-epitaxy structure, a drain partially in the hetero-epitaxy structure and spaced apart from the gate, and a source partially in the hetero-epitaxy structure and spaced apart from the gate and from the drain;
the buffer structure having a dual superlattice stack that comprises:
a first superlattice over an aluminum nitride layer of the buffer structure, the first superlattice having alternating pairs of respective aluminum nitride and aluminum gallium nitride sublayers;
an aluminum gallium nitride interlayer over the first superlattice; and
a second superlattice over the aluminum gallium nitride interlayer, the second superlattice having alternating pairs of respective aluminum nitride and gallium nitride sublayers.
2. The electronic device of claim 1, further comprising a silicon nitride cap layer over the hetero-epitaxy structure.
3. The electronic device of claim 2, wherein the silicon nitride cap layer has a thickness of 2-10 nm.
4. The electronic device of claim 1, wherein the transistor is an enhancement mode transistor, the electronic device further comprising a p-doped gallium nitride layer spaced apart from the source and from the drain over the hetero-epitaxy structure, the gate being over the p-doped gallium nitride layer.
5. The electronic device of claim 1, wherein the transistor is a depletion mode transistor, the gate being over the hetero-epitaxy structure.
6. The electronic device of claim 1, wherein:
the aluminum nitride sublayers of the first superlattice have respective thicknesses of 10-20 nm; and
the aluminum gallium nitride sublayers of the first superlattice have respective thicknesses of 15-35 nm, and an aluminum concentration of 60-80%.
7. The electronic device of claim 6, wherein:
the aluminum nitride sublayers of the second superlattice have respective thicknesses of 10-25 nm; and
the gallium nitride sublayers of the second superlattice have respective thicknesses of 15-35 nm.

8. The electronic device of claim 7, wherein the aluminum gallium nitride interlayer has a thickness of 10-100 nm, and an aluminum concentration of 40-60%.

9. The electronic device of claim 1, wherein:
the aluminum nitride sublayers of the second superlattice have respective thicknesses of 10-25 nm; and
the gallium nitride sublayers of the second superlattice have respective thicknesses of 15-35 nm.

10. The electronic device of claim 1, wherein the aluminum gallium nitride interlayer has a thickness of 10-100 nm, and an aluminum concentration of 40-60%.

11. A method of fabricating an electronic device, the method comprising:
forming a buffer structure over a substrate, including:
forming an aluminum nitride layer over the substrate; and
performing an epitaxial deposition process that deposits at least one layer of the buffer structure using an extrinsic carbon source gas;
forming a hetero-epitaxy structure over the buffer structure, the hetero-epitaxy structure including an aluminum nitride layer over the buffer structure and an aluminum gallium nitride layer over the aluminum nitride layer; and
forming a transistor having a gate over the hetero-epitaxy structure, a drain extended partially into the aluminum gallium nitride layer of the hetero-epitaxy structure and spaced apart from the gate, and a source extended partially into the aluminum gallium nitride layer of the hetero-epitaxy structure and spaced apart from the gate and from the drain.

12. The method of claim 11, wherein forming the buffer structure comprises:
performing a first epitaxial deposition process that forms a first superlattice over the aluminum nitride layer, the first superlattice having alternating pairs of aluminum nitride sublayers and aluminum gallium nitride sublayers;
performing a second epitaxial deposition process that forms an aluminum gallium nitride interlayer over the first superlattice; and
performing a third epitaxial deposition process that forms a second superlattice over the aluminum gallium nitride interlayer, the second superlattice having alternating pairs of aluminum nitride sublayers and gallium nitride sublayers.

13. The method of claim 11, further comprising:
performing a metal organic chemical vapor deposition process that forms a silicon nitride cap layer over the hetero-epitaxy structure.

14. The method of claim 11, wherein the extrinsic carbon source gas includes ethene or hexene.

15. A method of fabricating an electronic device, the method comprising:
forming a buffer structure over a substrate, including:
forming an aluminum nitride layer over the substrate; and
performing an epitaxial deposition process that deposits at least one layer of the buffer structure using an extrinsic carbon source gas;
forming a hetero-epitaxy structure over the buffer structure;
forming a transistor having a gate over the hetero-epitaxy structure, a drain partially in the hetero-epitaxy structure and spaced apart from the gate, and a source partially in the hetero-epitaxy structure and spaced apart from the gate and from the drain, wherein forming the buffer structure comprises:
performing a first epitaxial deposition process that forms a first aluminum gallium nitride sublayer over the aluminum nitride layer;
performing a second epitaxial deposition process that forms a second aluminum gallium nitride sublayer over the first aluminum gallium nitride sublayer using the extrinsic carbon source gas; and
performing a third epitaxial deposition process that forms a third aluminum gallium nitride sublayer over the second aluminum gallium nitride sublayer using the extrinsic carbon source gas.

16. The method of claim 15, further comprising:
performing a metal organic chemical vapor deposition process that forms a silicon nitride cap layer over the hetero-epitaxy structure.

17. A method of fabricating an electronic device, the method comprising:
forming a buffer structure over a substrate, including:
forming an aluminum nitride layer over the substrate;
performing a first epitaxial deposition process that forms a first superlattice over the aluminum nitride layer, the first superlattice having alternating pairs of aluminum nitride sublayers and aluminum gallium nitride sublayers;
performing a second epitaxial deposition process that forms an aluminum gallium nitride interlayer over the first superlattice; and
performing a third epitaxial deposition process that forms a second superlattice over the aluminum gallium nitride interlayer, the second superlattice having alternating pairs of aluminum nitride sublayers and gallium nitride sublayers;
forming a hetero-epitaxy structure over the buffer structure; and
forming a transistor having a gate over the hetero-epitaxy structure, a drain partially in the hetero-epitaxy structure and spaced apart from the gate, and a source partially in the hetero-epitaxy structure and spaced apart from the gate and from the drain.

18. The method of claim 17, wherein forming the buffer structure further comprises performing an epitaxial deposition process that deposits at least one layer of the buffer structure using an extrinsic carbon source gas.

19. The method of claim 18, wherein the extrinsic carbon source gas is or includes ethene.

20. The method of claim 17, further comprising:
performing a metal organic chemical vapor deposition process that forms a silicon nitride cap layer over the hetero-epitaxy structure.

* * * * *